(12) United States Patent
Atsumi

(10) Patent No.: US 9,990,965 B2
(45) Date of Patent: Jun. 5, 2018

(54) STORAGE DEVICE

(71) Applicant: Semiconductor Energy Laboratory Co., Ltd., Atsugi-shi, Kanagawa-ken (JP)

(72) Inventor: Tomoaki Atsumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 737 days.

(21) Appl. No.: 13/709,196

(22) Filed: Dec. 10, 2012

(65) Prior Publication Data
US 2013/0155790 A1 Jun. 20, 2013

(30) Foreign Application Priority Data

Dec. 15, 2011 (JP) ................... 2011-274094

(51) Int. Cl.
*G11C 5/06* (2006.01)
*G11C 7/06* (2006.01)
(Continued)

(52) U.S. Cl.
CPC ............ *G11C 7/06* (2013.01); *G11C 11/4091* (2013.01); *G11C 11/4097* (2013.01); *G11C 5/02* (2013.01)

(58) Field of Classification Search
CPC ... G11C 7/06; G11C 11/4091; G11C 11/4097; G11C 5/02
(Continued)

(56) References Cited

U.S. PATENT DOCUMENTS 5,060,191 A 10/1991 Nagasaki et al.
5,731,856 A 3/1998 Kim et al.
(Continued)

FOREIGN PATENT DOCUMENTS

EP 0676766 A 10/1995
EP 0905785 A 3/1999
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Anthan Tran
(74) *Attorney, Agent, or Firm* — Fish & Richardson P.C.

(57) ABSTRACT

Noise attributed to signals of a word line, in first and second bit lines which are overlapped with the same word line in memory cells stacked in a three-dimensional manner is reduced in a storage device with a folded bit-line architecture. The storage device includes a driver circuit including a sense amplifier, and first and second memory cell arrays which are stacked each other. The first memory cell array includes a first memory cell electrically connected to the first bit line and a first word line, and the second memory cell array includes a second memory cell electrically connected to the second bit line and a second word line. The first and second bit lines are electrically connected to the sense amplifier in the folded bit-line architecture. The first word line, first bit line, second bit line, and second word line are disposed in this manner over the driver circuit.

20 Claims, 12 Drawing Sheets

(51) Int. Cl.
    *G11C 11/4091* (2006.01)
    *G11C 11/4097* (2006.01)
    *G11C 5/02* (2006.01)

(58) Field of Classification Search
    USPC .......................................... 365/63, 189.011
    See application file for complete search history.

(56) References Cited

U.S. PATENT DOCUMENTS

| | | | |
|---|---|---|---|
| 5,742,544 A | 4/1998 | Foss | |
| 5,744,864 A | 4/1998 | Cillessen et al. | |
| 5,864,496 A | 1/1999 | Mueller et al. | |
| 6,191,442 B1 | 2/2001 | Matsufusa | |
| 6,195,282 B1 | 2/2001 | Foss | |
| 6,294,274 B1 | 9/2001 | Kawazoe et al. | |
| 6,366,491 B1 | 4/2002 | Foss | |
| 6,563,174 B2 | 5/2003 | Kawasaki et al. | |
| 6,661,723 B2 | 12/2003 | Foss | |
| 6,727,522 B1 | 4/2004 | Kawasaki et al. | |
| 6,839,260 B2 | 1/2005 | Ishii | |
| 6,846,703 B2 | 1/2005 | Shimoda et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,095,666 B2 | 8/2006 | Foss | |
| 7,105,868 B2 | 9/2006 | Nause et al. | |
| 7,177,187 B2 | 2/2007 | Ishii | |
| 7,189,992 B2 | 3/2007 | Wager, III et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,336,519 B2 | 2/2008 | Ishii | |
| 7,339,187 B2 | 3/2008 | Wager, III et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,486,580 B2 | 2/2009 | Foss | |
| 7,501,293 B2 | 3/2009 | Ito et al. | |
| 7,570,516 B2 | 8/2009 | Ishii | |
| 7,598,520 B2 | 10/2009 | Hirao et al. | |
| 7,609,573 B2 | 10/2009 | Foss | |
| 7,674,650 B2 | 3/2010 | Akimoto et al. | |
| 7,732,819 B2 | 6/2010 | Akimoto et al. | |
| 7,826,266 B2 | 11/2010 | Ishii | |
| 7,859,930 B2 | 12/2010 | Foss | |
| 7,888,207 B2 | 2/2011 | Wager, III et al. | |
| 7,993,964 B2 | 8/2011 | Hirao et al. | |
| 8,218,386 B2 | 7/2012 | Foss | |
| 8,441,878 B2 | 5/2013 | Foss | |
| 8,455,868 B2 | 6/2013 | Yamazaki et al. | |
| 8,508,967 B2 | 8/2013 | Yamazaki et al. | |
| 8,637,865 B2 | 1/2014 | Kato | |
| 8,803,142 B2 | 8/2014 | Yamazaki et al. | |
| 9,236,385 B2 | 1/2016 | Yamazaki et al. | |
| 9,349,735 B2 | 5/2016 | Yamazaki et al. | |
| 2001/0046027 A1 | 11/2001 | Tai et al. | |
| 2002/0056838 A1 | 5/2002 | Ogawa | |
| 2002/0067635 A1 | 6/2002 | Foss | |
| 2002/0132454 A1 | 9/2002 | Ohtsu et al. | |
| 2002/0172070 A1* | 11/2002 | Arimoto et al. | 365/149 |
| 2003/0189401 A1 | 10/2003 | Kido et al. | |
| 2003/0218221 A1 | 11/2003 | Wager, III et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0128815 A1 | 6/2007 | Iino et al. | |
| 2007/0141784 A1 | 6/2007 | Wager, III et al. | |
| 2007/0147129 A1* | 6/2007 | Kato | 365/185.22 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0215906 A1 | 9/2007 | Wu et al. | |
| 2007/0252928 A1 | 11/2007 | Ito et al. | |
| 2007/0263423 A1 | 11/2007 | Scheuerlein et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager, III et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0142888 A1 | 6/2009 | Tsuchiya | |
| 2009/0152506 A1 | 6/2009 | Umeda et al. | |
| 2009/0152541 A1 | 6/2009 | Maekawa et al. | |
| 2009/0154262 A1 | 6/2009 | Tokunaga | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0213531 A1 | 8/2010 | Asami et al. | |
| 2011/0089419 A1 | 4/2011 | Yamazaki et al. | |
| 2011/0156027 A1 | 6/2011 | Yamazaki et al. | |
| 2011/0205783 A1* | 8/2011 | Murooka | G11C 13/00 365/148 |
| 2011/0299318 A1 | 12/2011 | Kaneko et al. | |
| 2012/0057396 A1 | 3/2012 | Yamazaki et al. | |
| 2012/0063208 A1 | 3/2012 | Koyama et al. | |

(56) References Cited

U.S. PATENT DOCUMENTS

| | | |
|---|---|---|
| 2013/0256657 A1 | 10/2013 | Yamazaki et al. |
| 2016/0118418 A1 | 4/2016 | Yamazaki et al. |
| 2016/0260718 A1 | 9/2016 | Yamazaki et al. |

FOREIGN PATENT DOCUMENTS

| | | |
|---|---|---|
| EP | 1017100 A | 7/2000 |
| EP | 1603163 A | 12/2005 |
| EP | 1 737 044 A1 | 12/2006 |
| EP | 1 835 535 A2 | 9/2007 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-154388 A | 6/1990 |
| JP | 02-154389 A | 6/1990 |
| JP | 05-251705 A | 9/1993 |
| JP | 06-097366 A | 4/1994 |
| JP | 08-036885 A | 2/1996 |
| JP | 08-264794 A | 10/1996 |
| JP | 11-040772 A | 2/1999 |
| JP | 11-505377 A | 5/1999 |
| JP | 11-163299 A | 6/1999 |
| JP | 11-251518 A | 9/1999 |
| JP | 2000-044236 A | 2/2000 |
| JP | 2000-150900 A | 5/2000 |
| JP | 2001-274355 A | 10/2001 |
| JP | 2002-076356 A | 3/2002 |
| JP | 2002-512438 A | 4/2002 |
| JP | 2002-515641 A | 5/2002 |
| JP | 2002-517896 A | 6/2002 |
| JP | 2002-518848 A | 6/2002 |
| JP | 2002-289859 A | 10/2002 |
| JP | 2002-533928 A | 10/2002 |
| JP | 2003-086000 A | 3/2003 |
| JP | 2003-086808 A | 3/2003 |
| JP | 2004-103957 A | 4/2004 |
| JP | 3526552 B2 | 5/2004 |
| JP | 2004-273614 A | 9/2004 |
| JP | 2004-273732 A | 9/2004 |
| JP | 2006-502597 A | 1/2006 |
| JP | 2006-253699 A | 9/2006 |
| JP | 3825257 B2 | 9/2006 |
| JP | 2007-294897 A | 11/2007 |
| JP | 4272353 B2 | 6/2009 |
| JP | 2009-158939 A | 7/2009 |
| JP | 2009/528870 | 8/2009 |
| JP | 2011-109084 A | 6/2011 |
| JP | 2011-151383 A | 8/2011 |
| WO | 99/44229 A1 | 9/1999 |
| WO | 99/45582 A1 | 9/1999 |
| WO | 99/45582 A9 | 11/1999 |
| WO | 99/44229 A9 | 12/1999 |
| WO | 99/63527 A2 | 12/1999 |
| WO | 99/66551 A1 | 12/1999 |
| WO | 99/63527 A3 | 2/2000 |
| WO | 00/38234 A1 | 6/2000 |
| WO | 2004/038757 A2 | 5/2004 |
| WO | 2004/114391 A1 | 12/2004 |
| WO | WO-2007/142167 | 12/2007 |
| WO | 2010/097862 A1 | 9/2010 |
| WO | WO-2011/048968 | 4/2011 |
| WO | WO-2011/077967 | 6/2011 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

(56) References Cited

OTHER PUBLICATIONS

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IgZo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

(56) References Cited

OTHER PUBLICATIONS

Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GiZo (Ga2O3-In2O3-ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

STORAGE DEVICE

BACKGROUND OF THE INVENTION

1. Field of the Invention

The present invention relates to a structure of a storage device. In particular, the present invention relates to a structure of a folded dynamic RAM (dynamic random access memory: DRAM).

2. Description of the Related Art

The cost for a DRAM that is a storage device has been lowering; to further lower the cost, an increase in capacity has been actively researched and developed. The increase in capacity can be achieved by, for example, changing the layout of the memory cell and miniaturizing the element, but such a scale down of the dimension of the memory cell or reduction in the size of the element is limited.

In terms of the layout change of a memory cell, either an open bit-line architecture or a folded bit-line architecture may be adopted. The open bit-line architecture enables a scale down of the dimension of the memory cell but is weak against noise at the time of data reading. On the other hand, the folded bit-line architecture is strong against noise at the time of data reading, but it is difficult to scale down the dimension of the memory cell with the folded bit-line architecture. The reason why the folded bit-line architecture is strong against noise at the time of data reading is because a first bit line (reading bit line) and a second bit line (reference bit line), which are connected to a sense amplifier, are overlapped with the same word line, whereby noise attributed to the signal of the word line is superimposed equally on them to be cancelled.

Further, as another approach for the layout change of a memory cell, its elements may be stacked in a three-dimensional manner to scale down the dimension of the memory cell, as described in Patent Document 1 and Patent Document 2.

REFERENCE

Patent Document 1: Japanese Published Patent Application No. H11-40772
Patent Document 2: PCT International Publication No. 99/63527

SUMMARY OF THE INVENTION

In the above-described folded bit-line architecture, in order to scale down the dimension of a memory cell, a three-dimensional stack of the memory cells to increase the storage capacity per unit area can be considered. However, stacking memory cells simply in a three-dimensional manner leads to a large difference of noise attributed to the signal of the word line, between the first bit line and the second bit line which are overlapped with the same word line, in the case where the first bit line and the second bit line, which are connected to the sense amplifier, are stacked; thus, the noise becomes large.

One object of one embodiment of the present invention is to decrease noise attributed to a signal of a word line, in a first bit line and a second bit line which are overlapped with the same word line in the case where memory cells are stacked in a three-dimensional manner in a storage device with a folded bit-line architecture.

One embodiment of the present invention is a storage device including a driver circuit including a sense amplifier, and a first memory cell array and a second memory cell array which are stacked each other. The first memory cell array includes a first memory cell which is electrically connected to a first bit line and a first word line, and the second memory cell array includes a second memory cell which is electrically connected to a second bit line and a second word line. The first bit line and the second bit line are electrically connected to the sense amplifier, whereby a folded bit-line architecture is formed. The first word line, the first bit line, the second bit line, and the second word line are disposed in this manner over the driver circuit.

One embodiment of the present invention is a storage device including a first memory cell array and a second memory cell array which are driven by a driver circuit. The first memory cell array includes a first memory cell which is electrically connected to a first bit line and a first word line, and the second memory cell array includes a second memory cell which is electrically connected to a second bit line and a second word line. The driver circuit includes a sense amplifier to which the first bit line and the second bit line are electrically connected while intersecting the first word line and the second word line, whereby a folded bit-line architecture is formed. The first memory cell array and the second memory cell array are overlapped with each other. The first word line, the first bit line, the second bit line, and the second word line are disposed in this manner over the driver circuit.

In one embodiment of the present invention, it is preferable in the storage device that the first bit line and the second bit line be overlapped with each other with an interlayer insulating film provided therebetween.

In one embodiment of the present invention, it is preferable in the storage device that: the first memory cell include a first transistor including a first semiconductor layer, a first source electrode and a first drain electrode, a first gate insulating layer, and a first gate electrode which overlaps with the first semiconductor layer with the first gate insulating layer provided therebetween, and a first capacitor including one of the first source electrode and the first drain electrode, the first gate insulating layer, and a first conductive layer which overlaps with the one of the first source electrode and the first drain electrode with the first gate insulating layer provided therebetween; the first gate electrode be the first word line; and the other of the first source electrode and the first drain electrode be connected to the first bit line provided over the first transistor.

In one embodiment of the present invention, it is preferable in the storage device that: the second memory cell include a second transistor including a second semiconductor layer, a second source electrode and a second drain electrode, a second gate insulating layer, and a second gate electrode which overlaps with the second semiconductor layer with the second gate insulating layer provided therebetween, and a second capacitor including one of the second source electrode and the second drain electrode, the second gate insulating layer, and a second conductive layer which overlaps with the one of the second source electrode and the second drain electrode with the second gate insulating layer provided therebetween; the second gate electrode be the second word line; and the other of the second source electrode and the second drain electrode be connected to the second bit line provided under the second transistor.

In one embodiment of the present invention, it is preferable in the storage device that channel formation regions in the first semiconductor layer and the second semiconductor layer include an oxide semiconductor.

In one embodiment of the present invention, it is preferable in the storage device that the driver circuit is stacked under the first memory cell array and the second memory cell array.

In one embodiment of the present invention, it is preferable in the storage device that: the driver circuit include a third transistor; and the third transistor include a channel formation region formed in a single-crystal semiconductor substrate, a pair of impurity regions provided so as to interpose the channel formation region therebetween, a third gate insulating layer over the channel formation region, and a third gate electrode provided over the third gate insulating layer so as to overlap with the channel formation region.

One embodiment of the present invention enables a reduction of noise attributed to a signal of a word line, in a first bit line and a second bit line which are overlapped with the same word line, in the case where memory cells are stacked in a three-dimensional manner to decrease the minimum feature size in a storage device with a folded bit-line architecture. Accordingly, a storage device in which the data storage capacity is increased, and errors in data reading due to noise are reduced can be provided.

DETAILED DESCRIPTION OF THE INVENTION

Figure 1A:
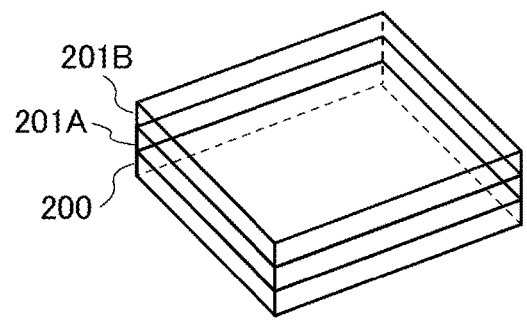
FIGS. 1A, 1B, and 1C are a top view, a circuit diagram, and a cross-sectional diagram showing a structure of a storage device.

Hereinafter, embodiments of the present invention are described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below. In describing structures of the present invention with reference to the drawings, the same reference numerals are used in common for the same portions throughout the drawings. The same hatching pattern is applied to similar portions without reference numerals in some cases. In addition, an insulating layer is not shown in a top view in some cases for convenience.

The position, the size, the range, or the like of each structure illustrated in the drawings and the like is not accurate one in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and do not infer limitation of the number of components.

In this specification and the like, the positional terms "over" and "under" do not necessarily mean the positions "directly on" and "directly under", respectively. For example, a "gate electrode over a/the gate insulating layer" encompasses the gate electrode over the gate insulating layer with any other component provided therebetween.

In addition, in this specification and the like, the term of a component such as "electrode" or "wiring" does not infer limitation of a function of the component. For example, the "electrode" is sometimes used as part of the "wiring", and vice versa. Furthermore, the term "electrode" or "wiring" also encompasses a plurality of "electrodes" or a plurality of "wirings" formed as one.

For example, a part of a word line may be used as a first gate electrode of a first transistor. A part of a capacitor line may be used as an electrode layer of a capacitor.

Further, functions of a "source" and a "drain" are switched to each other depending on the polarity of the transistor, the direction of current in circuit operation, and the like. Therefore, the terms "source" and "drain" can be replaced with each other in this specification and the like.

Note that in this specification, the state where A and B are connected to each other encompasses not only the state where A and B are directly connected to each other but also the state where A and B are electrically connected to each other.

Embodiment 1

A structure of a storage device of one embodiment of the present invention is described with reference to FIGS. 1A to 1C, FIGS. 2A and 2B, FIGS. 3A and 3B, FIG. 4, FIG. 5, and FIG. 6.

FIG. 1A is a conceptual diagram illustrating one example of a structure of a storage device. A storage device of one embodiment of the present invention has a stacked-layer structure in which a plurality of memory cell arrays is provided in an upper portion, and a driver circuit for driving the plurality of memory cell arrays is provided in a lower portion. The driver circuit may include a control circuit, a logic circuit, or an analog circuit. The driver circuit may also include an arithmetic circuit.

A storage device shown in FIG. 1A includes a memory cell array 201A (also called first memory cell array) including a plurality of memory cells and a memory cell array 201B (also called second memory cell array) including a plurality of memory cells in its upper portion, and includes a driver circuit 200 for driving the memory cell array 201A and the memory cell array 201B in its lower portion.

The memory cell array 201A and the memory cell array 201B are stacked over the driver circuit 200. Accordingly, the storage capacity per unit area can be increased.

The storage device of one embodiment of the present invention has a structure in which: a first memory cell array including a first memory cell connected to a first bit line and a first word line and a second memory cell array including a second memory cell connected to a second bit line and a second word line are stacked using a multilayer wiring technology; the first bit line in the first memory cell array and the second bit line in the second memory cell array are connected to a sense amplifier which is a driver circuit, whereby a folded bit-line architecture is formed; and the first word line, the first bit line, the second bit line, and the second word line are provided in this order over the driver circuit. A circuit diagram with the folded bit-line architecture including the sense amplifier is shown in FIG. 1B, and a cross-sectional structure of the first word line, the first bit line, the second bit line, and the second word line over the driver circuit is shown in FIG. 1C.

Figure 1B:
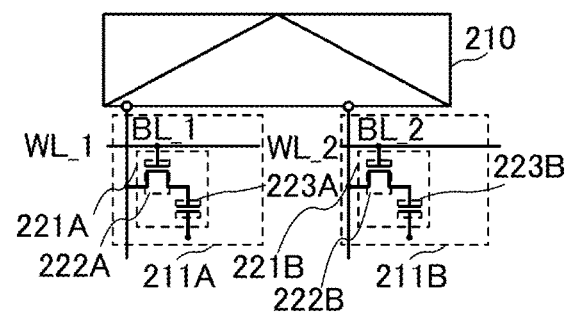
Figure 1C:
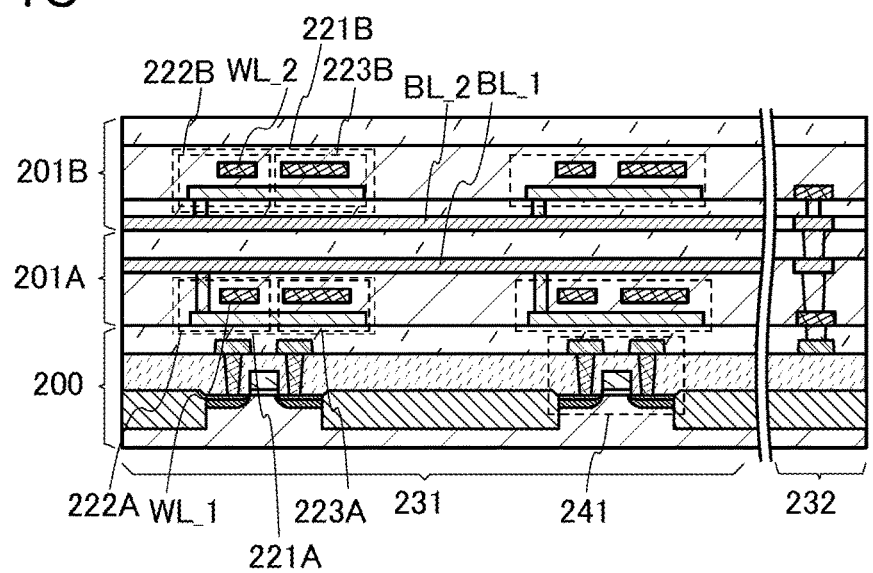

FIG. 1B is a circuit diagram illustrating the first memory cell and the second memory cell with bit lines connected to the sense amplifier in the folded bit-line architecture. In FIG. 1B, a first bit line BL_1 and a second bit line BL_2 are connected to the same sense amplifier 210. The first bit line BL_1 is connected to a first memory cell 211A, and the second bit line BL_2 is connected to a second memory cell 211B.

In FIG. 1B, the first memory cell 211A includes a transistor 222A (also called first transistor) and a capacitor 223A (also called first capacitor). A gate of the transistor 222A is connected to a first word line WL_1.

In FIG. 1B, the second memory cell 211B includes a transistor 222B (also called second transistor) and a capacitor 223B (also called second capacitor). A gate of the transistor 222B is connected to a second word line WL_2.

Shown in FIG. 1C is a pattern diagram of a cross section where the first memory cell 211A and the second memory cell 211B which are connected to the first bit line BL_1 and the second bit line BL_2, respectively in the folded bit-line architecture shown in FIG. 1B are stacked. In FIG. 1C, an element portion 231 where the transistors are stacked and a wiring portion 232 for electrically connecting layers are illustrated. Also in FIG. 1C, a structure where the driver circuit 200, the memory cell array 201A, and the memory cell array 201B, which are shown in FIG. 1A, are stacked is illustrated.

In the driver circuit 200, a transistor 241 including a semiconductor layer, a source electrode, a drain electrode, and a gate electrode is provided. Silicon, germanium, silicon germanium, silicon carbide, gallium arsenide, or the like can be used for the semiconductor layer of the transistor 241; a single-crystal semiconductor substrate is preferably used. A transistor using a single-crystal semiconductor substrate can operate at sufficiently high speed. Therefore, a variety of circuits (e.g., a logic circuit or a driver circuit) which need to operate at high speed can be favorably realized with the driver circuit 200.

In FIG. 1C, the first memory cell 221A in the memory cell array 201A includes the transistor 222A which is connected to the first word line WL_1 and the capacitor 223A. Further, the first bit line BL_1 is provided over the first memory cell 221A in the memory cell array 201A.

In FIG. 1C, the second memory cell 221B in the memory cell array 201B includes the second bit line BL_2. Further, the transistor 222B which is connected to the second word line WL_2 and the capacitor 223B are provided over the second bit line BL_2 in the memory cell array 201B.

As shown in FIG. 1C, a feature of one embodiment of the present invention lies in the storage device in which the first word line WL_1, the first bit line BL_1, the second bit line BL_2, and the second word line WL_2 are stacked in this order in the memory cell array 201A and the memory cell array 201B over the driver circuit 200.

Figure 2A:
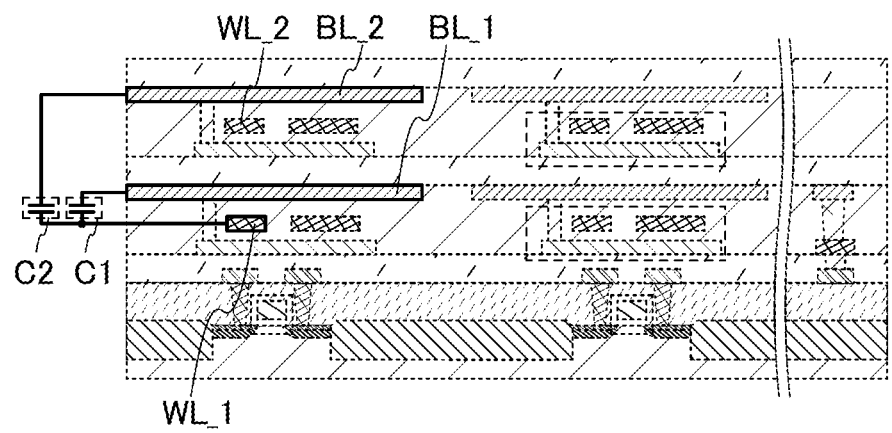
FIGS. 2A and 2B are diagrams for describing the effect of the structure of Embodiment 1.
Figure 2B:
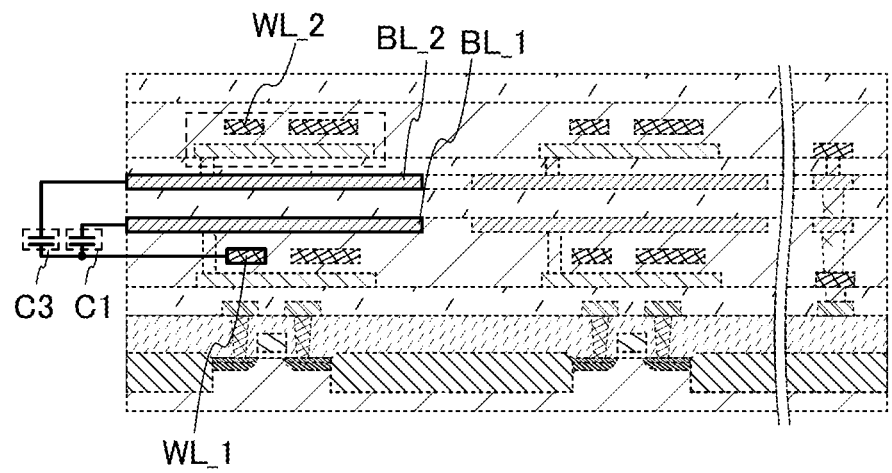

Here, FIG. 2A shows a cross-sectional structure of a storage device in which the stack order of layers is the same in the memory cell array 201A and the memory cell array 201B; the first word line WL_1, the first bit line BL_1, the second word line WL_2, and the second bit line BL_2 are stacked in this order. Further, FIG. 2B shows a cross-sectional structure of the storage device shown in FIG. 1C in which the first word line WL_1, the first bit line BL_1, the second bit line BL_2, and the second word line WL_2 are stacked in this order. FIG. 2A is compared to FIG. 2B, whereby an effect of one embodiment of the present invention is described.

FIG. 2A is a pattern diagram of the cross section in which the first word line WL_1, the first bit line BL_1, the second word line WL_2, and the second bit line BL_2 are stacked in this order, which is illustrated in a similar manner to FIG. 1C. In FIG. 2A, for easy understanding, the first word line WL_1, the first bit line BL_1, and the second bit line BL_2 which are used for explanation are indicated using a solid line, and the other components are indicated using a dotted line.

In FIG. 2A, in the storage device with a folded bit-line architecture, noise is superimposed on the first bit line BL_1 and the second bit line BL_2, which are overlapped with each other, by a change of potential of the first word line WL_1 or the second word line WL_2. A difference of this noise is, for example, determined by a difference between capacitance C1 formed by overlapping the first word line WL_1 with the first bit line BL_1 and capacitance C2 formed by overlapping the first word line WL_1 with the second bit line BL_2.

On the other hand, FIG. 2B is a pattern diagram of the cross section in which the first word line WL_1, the first bit line BL_1, the second bit line BL_2, and the second word line WL_2 are stacked in this order, which is illustrated in FIG. 1C. In FIG. 2B, for easy understanding, the first word line WL_1, the first bit line BL_1, and the second bit line BL_2 which are used for explanation are indicated using a solid line, and the other components are indicated using a dotted line, in a similar manner to FIG. 2A.

In FIG. 2B, in the storage device with a folded bit-line architecture, noise is superimposed on the first bit line BL_1 and the second bit line BL_2, which are overlapped with each other, by a change of potential of the first word line WL_1 or the second word line WL_2, in a similar manner to FIG. 2A. A difference of this noise is, for example, determined by a difference between capacitance C1 formed by overlapping the first word line WL_1 with the first bit line BL_1 and capacitance C3 formed by overlapping the first word line WL_1 with the second bit line BL_2.

In the pattern diagram of the cross section shown in FIG. 2B, the interlayer insulating layer is interposed not in the capacitance C1 but in the capacitance C3, and the difference of the capacitance is |C1−C3|. On the other hand, in the pattern diagram of the cross section shown in FIG. 2A, other layers such as the second word line WL_2 are interposed not in the capacitance C1 but in the capacitance C2, and the difference of the capacitance is |C1−C2|. Thus, the capacitance difference |C1−C3| is smaller than the capacitance difference |C1−C2|. Therefore, in FIGS. 1C and 2B which illustrate one embodiment of the present invention, noise attributed to a signal of a word line can be decreased in the first bit line and the second bit line which are overlapped with the same word line in the case where memory cells are stacked in a three-dimensional manner in the storage device with the folded bit-line architecture.

Next, configurations of the memory cell and peripheral circuitry for the memory cell are described.

Figure 3A:
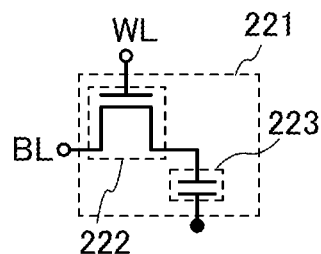
FIGS. 3A and 3B are circuit diagrams for describing a memory cell array of a storage device.

FIG. 3A illustrates one example of a circuit configuration of a memory cell applicable to either the first memory cell 221A or the second memory cell 221B described in FIG. 1B. A memory cell 221 shown in FIG. 3A includes a transistor 222 and a capacitor 223.

In the memory cell 221 shown in FIG. 3A, a bit line BL is connected to one of a source electrode and a drain electrode of the transistor 222. A word line WL is connected to a gate electrode of the transistor 222. The other of the source electrode and the drain electrode of the transistor 222 is connected to the capacitor 223.

Next, writing and retaining data in the memory cell 221 shown in FIG. 3A is described.

First, the potential of the word line WL is set to a potential at which the transistor 222 is turned on, so that the transistor 222 is turned on. Thus, the potential of the bit line BL is supplied to a first terminal of the capacitor 223 (writing). After that, the potential of the word line WL is set to a potential at which the transistor 222 is turned off, so that the transistor 222 is turned off, whereby the voltage of the capacitor 223 is retained (retaining)

The off-state current of the transistor 222 can be extremely small, whereby the potential of the first terminal of the capacitor 223 (or charge accumulated in the capacitor 223) can be retained for a long time.

Next, reading of data is described. The transistor 222 is turned on, so that the bit line BL which is in a floating state is electrically connected to the capacitor 223, and the charge is redistributed between the bit line BL and the capacitor 223. As a result, the potential of the bit line BL is changed. The amount of change of the potential of the bit line BL varies depending on the charge accumulated in the capacitor 223.

For example, where V is the potential of one electrode of the capacitor 223, C is the capacitance of the capacitor 223, CB is the capacitance of the bit line BL (hereinafter also referred to as bit line capacitance), and VB0 is the potential of the bit line BL before charge redistribution, the potential of the bit line BL after the charge redistribution is (CB×VB+C×V)/(CB+C). Therefore, it can be found that assuming that the memory cell 221 has either of two states in which the potentials of the one electrode of the capacitor 223 are V1 and V0 (V1>V0), the potential of the bit line BL in the case of retaining the potential V1 (=(CB×VB0+C×V1)/(CB+C)) is higher than the potential of the bit line BL in the case of retaining the potential V0 (=(CB×VB0+C×V0)/(CB+C)).

Then, the potential of the bit line BL is compared with a predetermined potential, whereby data can be read.

Figure 3B:
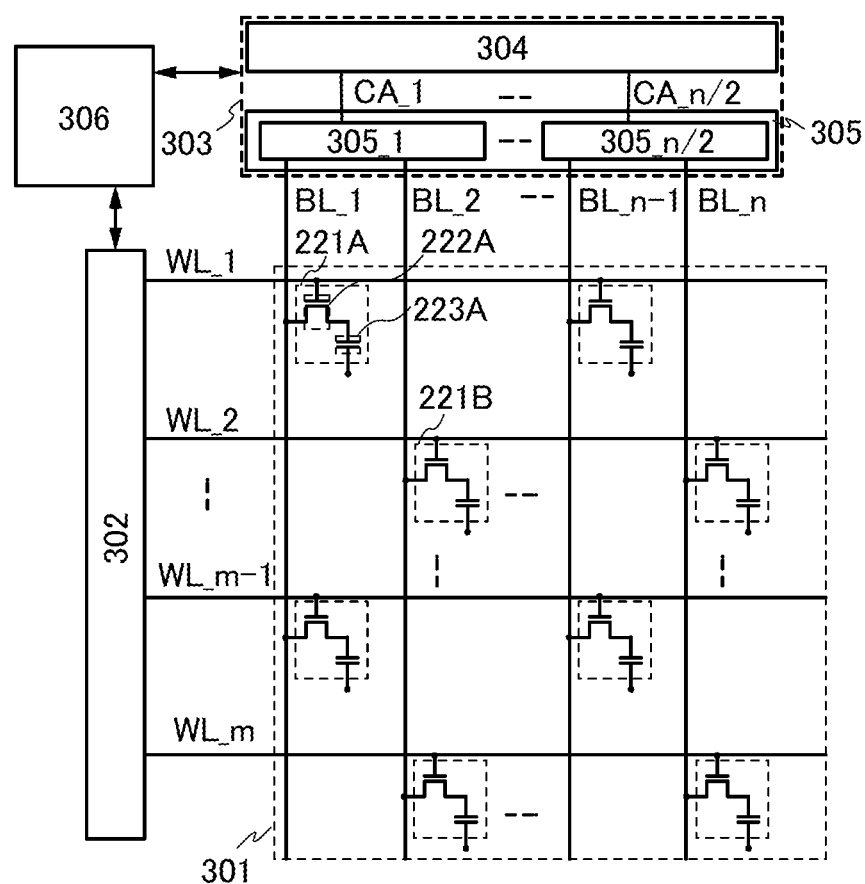

FIG. 3B is a circuit diagram of a memory cell array 301 including the plurality of memory cells 211 described in FIG. 3A and a part of the peripheral circuitry. In the circuit diagram in FIG. 3B, the memory cell array 301 and the part of the peripheral circuitry are shown as if provided in the same plane, for easy understanding. However, in the actual storage device, the part of the peripheral circuitry is provided under the memory cell array 301. Further, although the memory cell array 301 is shown as one memory cell array, the memory cells are separated into a first memory cell array and a second memory cell array, and the memory cells in the first memory cell array and the memory cells in the second memory cell array are overlapped with each other as described in FIGS. 1A to 1C.

The memory cell array 301 shown in FIG. 3B has m word lines WL_1 to WL_m, n bit lines BL_1 to BL_n, first memory cells 221A connected to the word lines at odd-numbered rows and the bit lines at odd-numbered columns, and second memory cells 221B connected to the word lines at even-numbered rows and the bit lines at even-numbered columns. The word lines WL_1 to WL_m are connected to a word-line driver circuit 302. The bit lines BL_1 to BL_n are connected to a bit-line driver circuit 303. Further, the word-line driver circuit 302 and the bit-line driver circuit 303 are each connected to a memory control circuit 306.

The bit-line driver circuit 303 includes a column decoder 304 and a sense amplifier group 305, and the sense amplifier group 305 includes sense amplifiers 305_1 to 305_n/2. The column decoder 304 is connected to the sense amplifiers 305_1 to 305_n/2 through column address lines CA_1 to CA_n/2.

Figure 4:
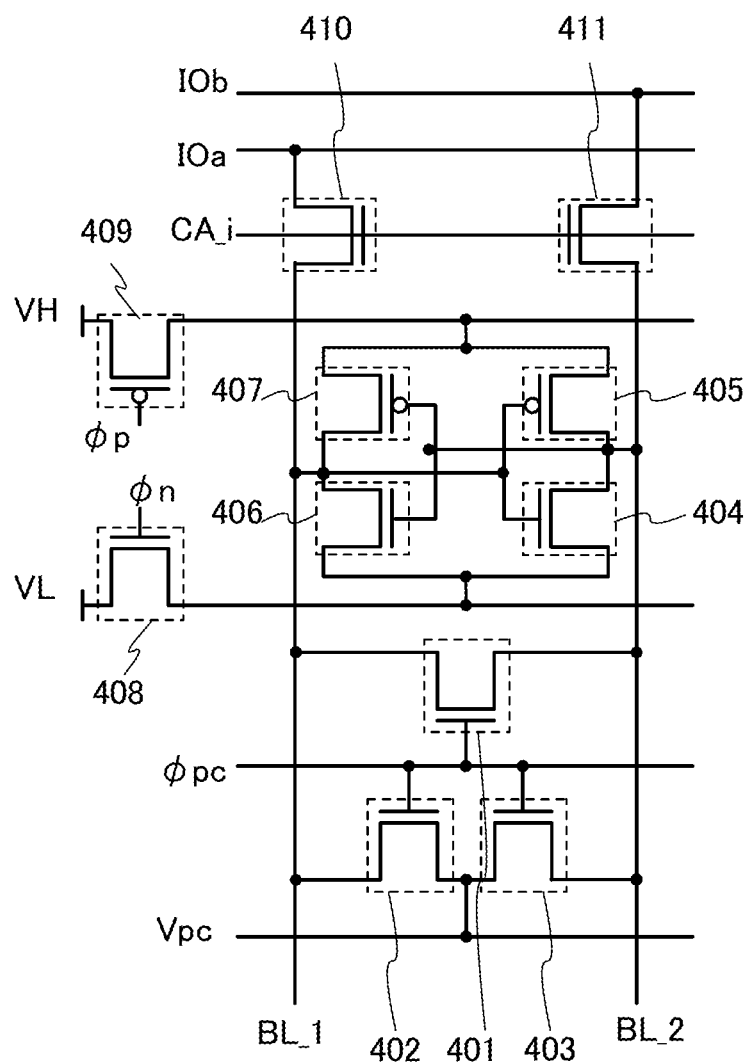
FIG. 4 is a diagram for describing a circuit configuration of a sense amplifier.

FIG. 4 illustrates a circuit configuration of the sense amplifier 305_1 which can be applied to the sense amplifier group 305.

In the sense amplifier illustrated in FIG. 4, a gate electrode of a transistor 401, a gate electrode of a transistor 402, and a gate electrode of a transistor 403 are connected to a signal line φpc. One of a source electrode and a drain electrode of the transistor 402 and one of a source electrode and a drain electrode of the transistor 403 are connected to a signal line Vpc. The other of the source electrode and the drain electrode of the transistor 402 is connected to the first bit line BL_1. The other of the source electrode and the drain electrode of the transistor 403 is connected to the second bit line BL_2. One of a source electrode and a drain electrode of the transistor 401 is connected to the first bit line BL_1 and the other of the source electrode and the drain electrode of the transistor 401 is connected to the second bit line BL_2. A gate electrode of a transistor 404, a gate electrode of a transistor 405, one of a source electrode and a drain electrode of a transistor 406, one of a source electrode and a drain electrode of a transistor 407, and the first bit line BL_1 are connected to each other. A gate electrode of the transistor 406, a gate electrode of the transistor 407, one of a source electrode and a drain electrode of the transistor 404, one of a source electrode and a drain electrode of the transistor 405, and the second bit line BL_2 are connected to each other. The other of the source electrode and the drain electrode of the transistor 404, the other of the source electrode and the drain electrode of the transistor 406, and one of a source electrode and a drain electrode of a transistor 408 are connected to each other. The other of the source electrode and the drain electrode of the transistor 405, the other of the source electrode and the drain electrode of the transistor 407, and one of a source electrode and a drain electrode of a transistor 409 are connected to each other. One of a source electrode and a drain electrode of a transistor 401 is connected to the first bit line BL_1. The other of the source electrode and the drain electrode of the transistor 410 is connected to a signal line IOa. One of a source electrode and a drain electrode of a transistor 411 is connected to the second bit line BL_2. The other of the source electrode and the drain electrode of the transistor 411 is connected to a signal line IOb. A gate electrode of the transistor 410, a gate electrode of the transistor 411, and a column address line CA_i are connected to each other. A potential VH is supplied to the other of the source electrode and the drain electrode of the transistor 409, and a potential VL is supplied to the other of the source electrode and the drain electrode of the transistor 408.

In the sense amplifier illustrated in FIG. 4, the transistor 405, the transistor 407, and the transistor 409 are p-channel transistors, and the transistors 401 to 404, the transistor 406, the transistor 408, the transistor 410, and the transistor 411 are n-channel transistors.

Next, the case where writing, retaining, and reading data is performed on the memory cell array 301 in FIG. 3B is described with reference to FIGS. 3A and 3B, FIG. 4, and FIG. 5. It is assumed that the one electrode of the capacitor in each memory cell retains either of two states, a potential VDD and a potential VSS; a state in which the potential VDD is retained is data "1" and a state in which the potential VSS is retained is data "0". The case where data "1" is written and read into/from the first memory cell 221A at the first row at the first column in the memory cell array 301 shown in FIG. 3B is described below. That is, the case where the first row is the selected row and the first column is the selected column is described.

In the case where data is written into the first memory cell 221A at the first row at the first column shown in FIG. 3B, the potential VDD is supplied to the first-column column address line CA_1 (also referred to as "the column address line CA_1 is activated"). As a result, the first bit line BL_1 and the second bit line BL_2 are electrically connected the signal line IOa and the signal line IOb, respectively. In the sense amplifier illustrated in FIG. 4, the potential supplied to a signal line φn and the potential supplied to a signal line φp are VDD and VSS, respectively. Thus, a predetermined power supply voltage (a potential difference between the potential VL and the potential VH) is input to the sense amplifier (also referred to as "the sense amplifier is activated"). At this time, the potential supplied to the signal line φpc is VSS. Here, the potential VH can be set to VDD and the potential VL can be set to VSS.

Then, a read circuit, a write circuit, and a latch circuit group included in the memory control circuit 306 illustrated in FIG. 3B supply potentials to the signal line IOa and the signal line IOb, which correspond to data to be written. For example, when data "1" is written into the first memory cell 221A at the first row at the first column, the potential VDD is supplied to the signal line IOa and the potential VSS is supplied to the signal line IOb. As a result, the potential VDD is supplied to the first bit line BL_1 and VSS is supplied to the second bit line BL_2. The potentials of the first bit line BL_1 and the second bit line BL_2 are kept at VDD and VSS even when the column address line CA_1 is deactivated (here, supplied with the potential VSS) as long as the sense amplifier is in the state of being activated.

Next, the first word line WL_1, which is at the selected row, is activated, so that the transistor 222A in the first memory cell 221A at the first row at the first column is turned on. Here, a potential VDDH which is higher than the potential VDD is supplied to the first word line WL_1. As a result, the potential VDD is supplied to the one electrode of the capacitor 223A in the first memory cell 221A at the first row at the first column. After that, the first word line WL_1 is deactivated (here, supplied with the potential VSS), so that the transistor 222A in the first memory cell 221A at the first row at the first column is turned off. In this manner, data "1" can be written into the first memory cell 221A at the first row at the first column. In addition, the potential of the one electrode of the capacitor 223A (or charge accumulated in the capacitor 223A) can be retained by turning off the transistor 222A in the first memory cell 221A at the first row at the first column.

Although the case of writing data "1" is described here, the same applies to the case of writing data "0".

Figure 5:
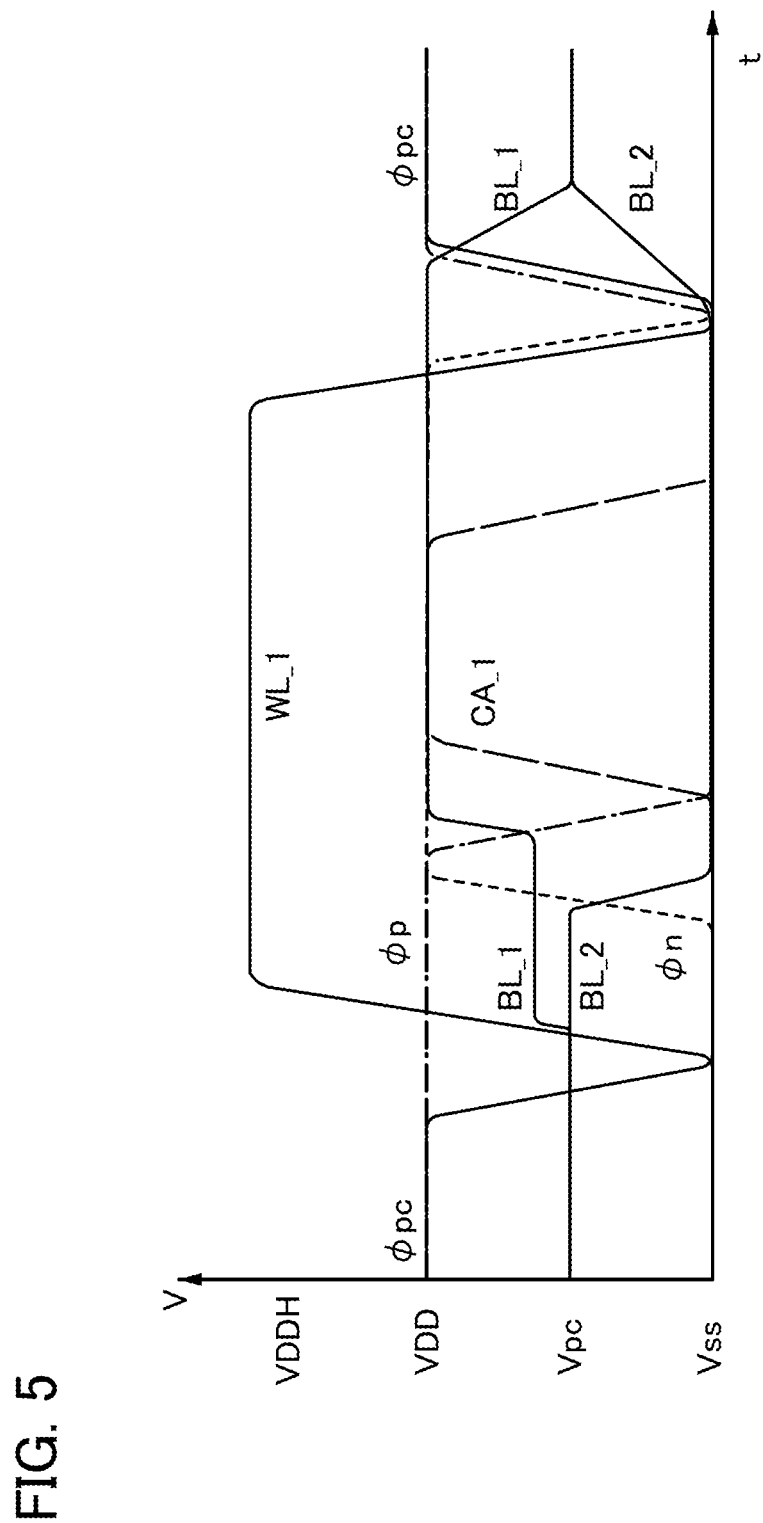
FIG. 5 is a timing chart for describing operation of a storage device.

Next, the case where data is read from the first memory cell 221A at the first row at the first column is described with reference to a timing chart shown in FIG. 5.

To read data from the first memory cell 221A at the first row at the first column, the potential VDD is supplied to the signal line φpc to precharge the first bit line BL_1 and the second bit line BL_2, whereby the potential Vpc is supplied to the first bit line BL_1 and the second bit line BL_2. Here, the potential Vpc is VDD/2. Then, the potential VSS is applied to the signal line φpc, so that the precharge is completed.

Next, the first word line WL_1, which is at the selected row, is activated, so that the transistor 222A in the first memory cell 221A at the first row at the first column is turned on. Here, the potential VDDH which is higher than the potential VDD is supplied to the first word line WL_1. As a result, the charge is redistributed between the first bit line BL_1 and the capacitor 223A in the first memory cell 221A at the first row at the first column to slightly increase the potential of the first bit line BL_1.

Next, the sense amplifier is activated. Here, first, the potential supplied to the signal line φn is changed from VSS to VDD, so that the potential VL is supplied to the n-channel transistor 408 in the sense amplifier. As a result, the sense amplifier amplifies the difference between the potential of the first bit line BL_1 and the potential of the second bit line BL_2 because the potential of the first bit line BL_1 is slightly higher than the potential of the second bit line BL_2, so that the potential of the second bit line BL_2 is decreased to the potential VL. Then, the potential supplied to the signal line φp is changed from VDD to VSS, the potential VH is supplied to the p-channel transistor 409 in the sense amplifier. As a result, the sense amplifier amplifies the difference between the potential of the second bit line BL_2 and the potential of the first bit line BL_1 because the potential of the second bit line BL_2 is slightly lower than the potential of the first bit line BL_1, so that the potential of the first bit line BL_1 is increased to the potential VH. Consequently, the potential VH and the potential VL are supplied to the first bit line BL_1 and the second bit line BL_2, respectively. In an example shown in FIG. 5, the potential VH is VDD, and the potential VL is VSS.

Next, the first-column column address line CA_1, which is at the selected column, is activated. Here, the potential VDD is supplied to the column address line CA_1. As a result, the first bit line BL_1 and the second bit line BL_2 are electrically connected to the signal line IOa and the signal line IOb, respectively, which are connected to the read circuit, the write circuit, and the latch circuit group which are included in the memory control circuit 306, so that the potential of the first bit line BL_1 and the potential of the second bit line BL_2 are read.

In this manner, data is read from the first memory cell 221A at the first row at the first column.

After the data stored in the first memory cell 221A at the first row at the first column is read out to the read circuit, the write circuit, and the latch circuit group, the column address line CA_1 is deactivated (here, supplied with the potential VSS), so that the first bit line BL_1 and the second bit line BL_2 are electrically disconnected to the signal line IOa and the signal line IOb, respectively. Then, the first word line WL_1 is deactivated (here, supplied with the potential VSS), so that the transistor 222A in the first memory cell 221A at the first row at the first column is turned off. At this time, data "1" is stored again in the first memory cell 221A at the first row at the first column. After that, the sense amplifier may be deactivated by changing the potential supplied to the signal line φn from VDD to VSS and changing the potential supplied to the signal line φp from VSS to VDD. Further, the first bit line BL_1 and the second bit line BL_2 may be precharged by supplying the potential VDD to the signal line φpc.

In this manner, data "1" can be read from the first memory cell 221A at the first row at the first column.

Although the case of reading data "1" from the first memory cell 221A at the first row at the first column is described here, a similar read operation to this case applies to the case of reading data "0". In that case, the charge is redistributed between the first bit line BL_1 and the capacitor 223A in the first memory cell 221A at the first row at the first column to slightly decrease the potential of the first bit line BL_1. The sense amplifier amplifies this difference to decreases the potential of the first bit line BL_1 to the potential VL and increases the potential of the second bit line BL_2 to the potential VH.

The circuit configuration of the memory cell array and the driving method thereof are described above.

According to one embodiment of the present invention, a structure is provided in which: a first memory cell array including a first memory cell connected to a first bit line and a first word line and a second memory cell array including a second memory cell connected to a second bit line and a second word line are stacked using a multilayer wiring technology; and the first bit line in the first memory cell array and the second bit line in the second memory cell array are connected to a sense amplifier which is a driver circuit, whereby a folded bit-line architecture is formed. The first word line, the first bit line, the second bit line, and the second word line are provided in this order over the driver circuit. For example, in the circuit diagram shown in FIG. 3B, the memory cell array 301 is divided into a first memory cell array consisting of memory cells at odd-numbered rows at odd-numbered columns and a second memory cell array consisting of memory cells at even-numbered rows at even-numbered columns, and the first memory cell array and the second memory cell array are stacked. Further, the first word line, the first bit line, the second bit line, and the second word line are provided in this order over the driver circuit, whereby noise attributed to a signal of the word line can be decreased in the first bit line and the second bit line which are overlapped with the same word line in the case where memory cells are stacked in a three-dimensional manner. Further, storage capacity per unit area can be increased.

Next, one example of a block diagram including the peripheral circuitry of the driver circuit which is stacked to overlap with the memory cell array is described.

Figure 6:
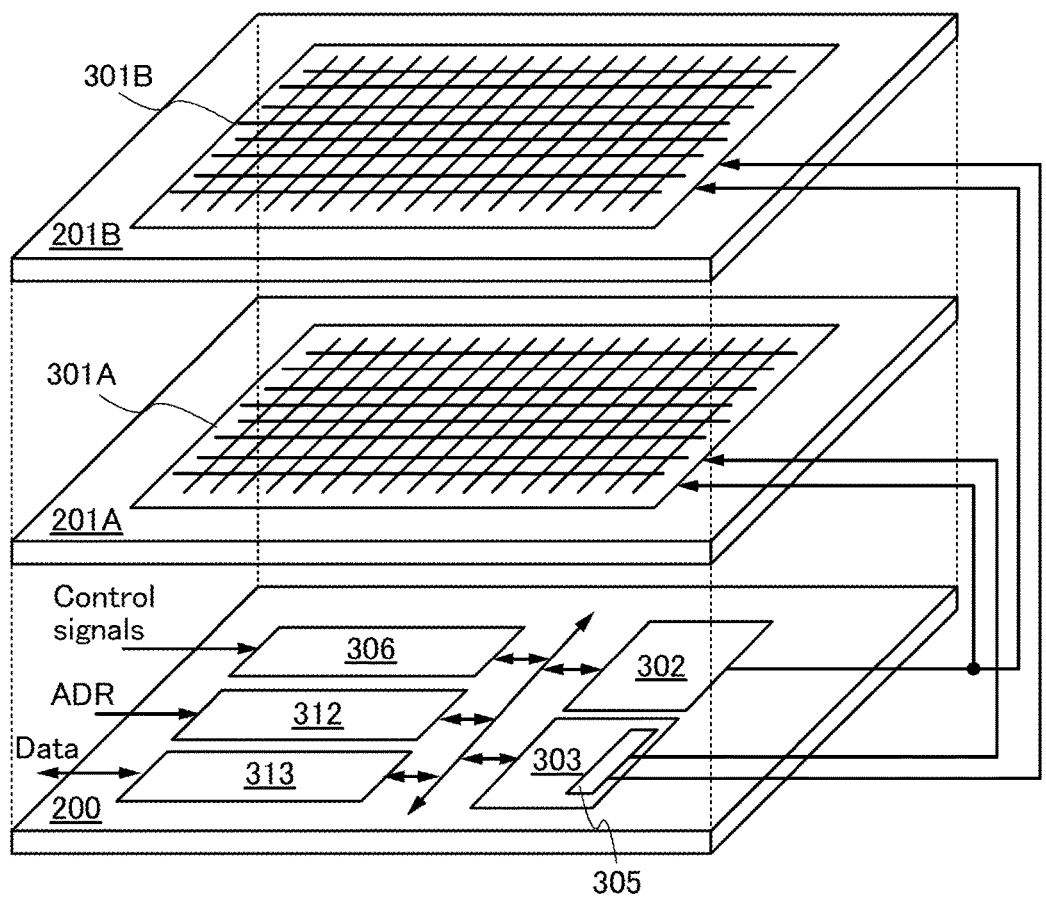
FIG. 6 is a pattern diagram for describing a structure of a storage device.

FIG. 6 is a block diagram of the driver circuit 200 in the lower portion of the storage device shown in FIGS. 1A to 1C, and illustrates the first memory cell array 201A and the second memory cell array 201B which are stacked over the driver circuit 200.

A driver circuit shown in FIG. 6 includes, in addition to the word-line driver circuit 302, the bit-line driver circuit 303 including the sense amplifier group 305, and the memory control circuit 306 which are shown in FIG. 3B, an address buffer 312 and an I/O buffer 313.

A variety of control signals (CS, RAS, CAS, WE, and/or the like) are input to the memory control circuit 306. The memory control circuit 306 generates a variety of control signals and outputs to a variety of circuits.

An address signal ADR is input to the address buffer 312 from the outside, and is output to the word-line driver circuit 302 and the bit-line driver circuit 303 in accordance with the control signal.

Data is input from the outside to the I/O buffer 313 through data signal lines, and output to the bit-line driver circuit 303. In addition, data stored in the memory cell is input to the I/O buffer 313, and is output to the outside.

As described above, the structure of this embodiment enables a reduction of noise attributed to a signal of a word line, in a first bit line and a second bit line which are overlapped with the same word line, in the case where memory cells are stacked in a three-dimensional manner in a storage device with a folded bit-line architecture.

This embodiment can be implemented in appropriate combination with any structure described in the other embodiments.

Embodiment 2

In this embodiment, a structure and a manufacturing method of a storage device of one embodiment of the present invention are described with reference to FIGS. 7A and 7B, FIG. 8, FIGS. 9A and 9B, and FIGS. 10A and 10B.

Figure 7A:
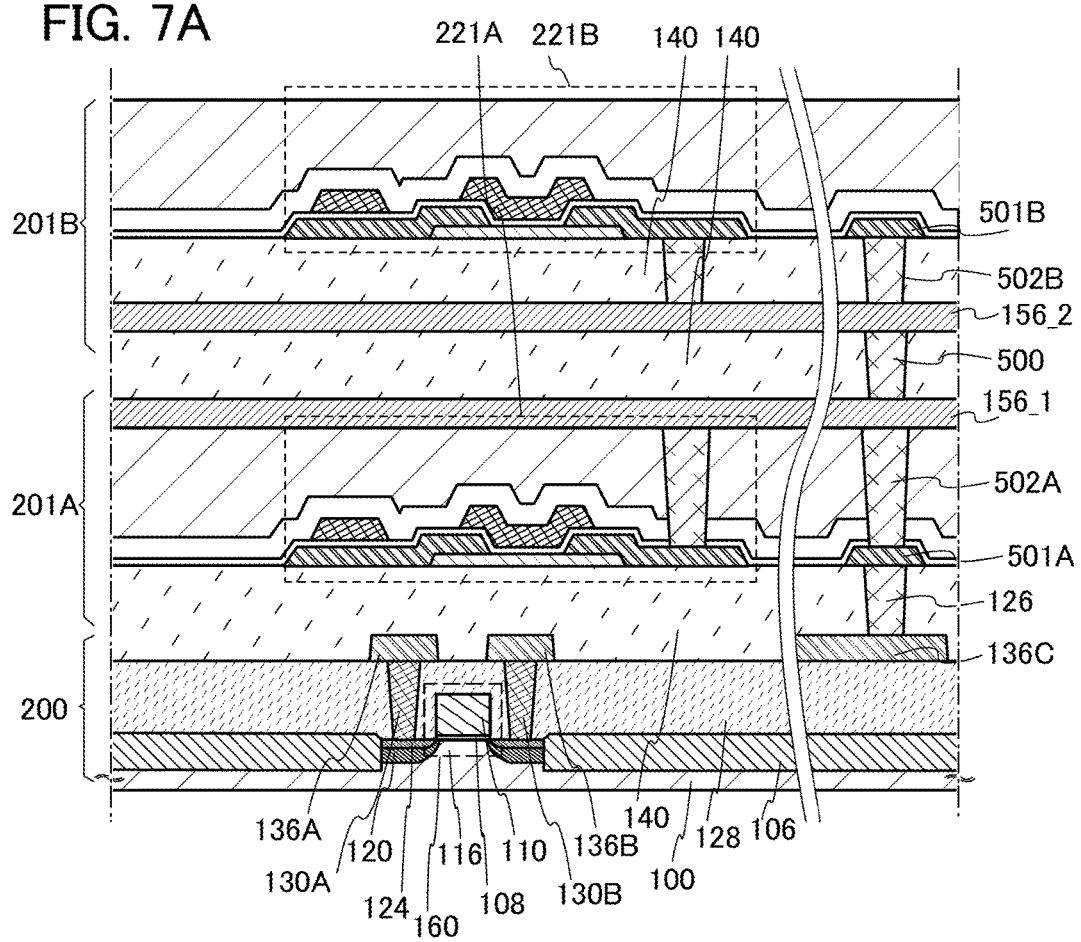
FIGS. 7A and 7B are cross-sectional diagrams for describing a structure of a storage device.

FIG. 7A is a cross-sectional diagram of a storage device. FIG. 7A is the cross-sectional diagram parallel to the channel length direction of a transistor in the storage device. The storage device illustrated in FIG. 7A includes the memory cell array 201A and the memory cell array 201B in its upper portion and the driver circuit 200 in its lower portion. Further, the first memory cell 221A is illustrated as a typical example in the memory cell array 201A, and the second memory cell 221B is illustrated as a typical example in the memory cell array 201B.

Figure 7B:
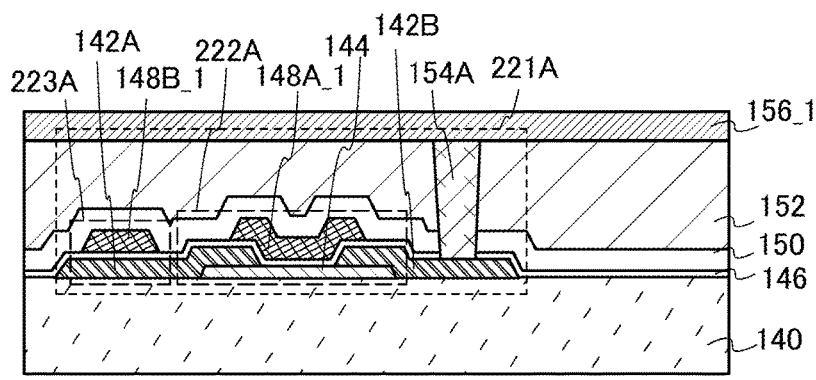

FIG. 7B illustrates a structure of the memory cell 221A in FIG. 7A in detail. The memory cell 221B provided over the memory cell 221A can have a structure which is similar to that of the memory cell 221A except the arrangement of a conductive layer serving as a bit line. The memory cell array 201A in the upper portion includes the transistor 222A which uses, for example, a thin-film semiconductor layer as a channel formation region, and the driver circuit 200 in the lower portion includes a transistor 160 which uses, for example, a single-crystal semiconductor substrate as a channel formation region.

Either an n-channel transistor or a p-channel transistor can be used as the transistor 160. Here, the case where the transistor 160 and the transistor 222A are both n-channel transistors is described.

A technical essence in one embodiment of the present invention lies in that a first word line, a first bit line, a second bit line, and a second word line are provided in this order over a driver circuit in a structure in which a first memory cell array including a first memory cell connected to the first bit line and the first word line and a second memory cell array including a second memory cell connected to the second bit line and the second word line are stacked using a multilayer wiring technology, and the first bit line in the first memory cell array and the second bit line in the second memory cell array are connected to a sense amplifier which is the driver circuit in a folded bit-line architecture. Therefore, details of the storage device, such as materials for the storage device and the structure of the storage device, are not necessarily limited to those described here.

The transistor 160 includes a channel formation region 116 provided in a substrate 100 including a semiconductor material (e.g., silicon); impurity regions 120 provided such that the channel formation region 116 is provided therebetween; intermetallic compound regions 124 in contact with the impurity regions 120; a gate insulating layer 108 provided over the channel formation region 116; a gate electrode 110 provided over the gate insulating layer 108; and a source or drain electrode 130A and a source or drain electrode 130B electrically connected to the intermetallic compound regions 124. Further, an insulating layer 128 is provided so as to cover the transistor 160. The source or drain electrode 130A and the source or drain electrode 130B are connected to the intermetallic compound regions 124 through openings formed in the insulating layer 128. Over the insulating layer 128, an electrode 136A is formed in contact with the source or drain electrode 130A, and an electrode 136B is formed in contact with the source or drain electrode 130B.

Further, an element isolation insulating layer 106 is provided over the substrate 100 so as to surround the transistor 160, and the insulating layer 128 is provided over the transistor 160. To realize high integration, it is preferable that the transistor 160 do not have a sidewall insulating layer as illustrated in FIG. 7A.

In the storage device illustrated in FIG. 7A, an insulating film 140 is provided between the lower-layer memory cell array 201A and the driver circuit 200 in the lower portion, between a conductive layer functioning as a bit line of the upper-layer memory cell array 201B and a conductive layer functioning as a bit line of the lower-layer memory cell array 201A, and between the conductive layer functioning as the bit line of the upper-layer memory cell array 201B and a semiconductor layer in the upper-layer memory cell array 201B. In the case where a plurality of memory cell arrays is stacked, a surface of the insulating film 140 is preferably planarized by CMP or the like.

The transistor 222A includes a semiconductor layer 144 provided over the insulating layer 140 and the like; an electrode 142A and an electrode 142B which are connected to the semiconductor layer 144; a gate insulating layer 146 covering the semiconductor layer 144, the electrode 142A, and the electrode 142B; and an electrode 148A_1 provided over the gate insulating layer 146 so as to overlap with the semiconductor layer 144. The electrode 148A_1 functions as a gate electrode of the transistor 222A. One of the electrode 142A and the electrode 142B functions as a drain electrode of the transistor 222A and the other functions as a source electrode of the same.

As a semiconductor material of the semiconductor layer 144, amorphous silicon, microcrystalline silicon, polysilicon, an oxide semiconductor, an organic semiconductor, or the like can be used.

The oxide semiconductor is preferable as the semiconductor material of the semiconductor layer 144. The oxide semiconductor used for the semiconductor layer 144 is preferably highly purified by sufficiently removing an impurity such as hydrogen therefrom and then sufficiently supplying oxygen thereto. Specifically, the concentration of hydrogen in the oxide semiconductor is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$, for example. The concentration of hydrogen in the oxide semiconductor is measured by secondary ion mass spectrometry (SIMS). The oxide semiconductor in which the hydrogen concentration is sufficiently reduced and defect levels in the energy gap due to oxygen deficiency are reduced by sufficient supply of oxygen has a carrier concentration of less than $1\times10^{12}$/cm$^3$, preferably less than $1\times10^{11}$/cm$^3$, more preferably less than $1.45\times10^{10}$/cm$^3$. For example, the off-state current (here, current per micrometer (μm) of channel width) at room temperature (25° C.) is less than or equal to 100 zA (1 zA (zeptoampere) is $1\times10^{-21}$ A), preferably less than or equal to 10 zA. In this manner, by using an i-type (intrinsic) or substantially i-type oxide semiconductor, a transistor which has extremely favorable off-state current characteristics can be obtained as the transistor 222A. Hereinafter, description is made assuming that an oxide semiconductor is used as a semiconductor material of the semiconductor layer 144.

A transistor using an oxide semiconductor material can realize an extremely small off-state current. Owing to this feature, the memory cell 221A can retain stored data for an extremely long time. In other words, refresh operation is made unnecessary or the frequency of refresh operation can be reduced to be extremely low, whereby power consumption can be sufficiently reduced. Further, stored data can be retained for a long time even during a period in which power is not supplied. Here, a normally-off (enhancement) transistor may be used as the transistor 222A, and a ground potential may be input to the gate of the transistor 222A in the case where power is not supplied, so that the transistor 222A can remain off and stored data can be kept retained in the case where power is not supplied.

Further, the memory cell 221A does not require high voltage for writing data and does not have the problem of deterioration of the element. For example, unlike a conventional nonvolatile memory, it is not necessary to inject and extract electrons into/from a floating gate, and thus a problem such as deterioration of a gate insulating layer does not occur at all. That is, the memory cell 221A does not have a limitation on the number of times data can be rewritten, which is a problem of the conventional nonvolatile memory, and the reliability thereof is drastically improved. Further, writing of data is performed by turning the transistor 222A on and off, which enables high-speed operation to be easily realized. In addition, there is no need of operation for erasing data.

The transistor using an oxide semiconductor material can also be applied to a transistor in the memory cell array 201B as well as the transistor 222A.

The capacitor 223A includes the electrode 142A, the gate insulating layer 146, and a conductive layer 148B_1. That is, the electrode 142A functions as one electrode of the capacitor 223A, and the conductive layer 148B_1 functions as the other electrode of the capacitor 223A. With such a structure, sufficient capacitance can be secured.

An insulating layer 150 and an insulating layer 152 are provided over the transistor 222A and the capacitor 223A. Further, an electrode 154A is provided in an opening formed in the gate insulating layer 146, the insulating layer 150, the insulating layer 152, and the like, and a wiring 156_1 which is connected to the electrode 154A is formed over the insulating layer 152. The wiring 156_1 can function as a bit line. The electrode 148A_1 can function as a word line. Further, the conductive layer 148B_1 can function as a capacitor line, though not shown.

The wiring 156_1 included in the memory cell array 201A is connected to an electrode 136C through an electrode 502A, an electrode 501A, and an electrode 126. Thus, the lower-layer driver circuit 200 can be connected to the bit line of the upper-layer memory cell array 201A.

Further, a wiring 1562 which functions as the bit line of the memory cell array 201B is connected to the electrode 136C through an electrode 500, the wiring 156_1, the electrode 502A, the electrode 501A, and the electrode 126. Thus, the lower-layer driver circuit 200 can be connected to the bit line of the upper-layer memory cell array 201A. Further, a wiring 501B formed in the same layer as the wiring which functions as the word line of the memory cell array 201B is connected to the electrode 136C through an electrode 502B, the wiring 1562, the electrode 500, the wiring 156_1, the electrode 502A, the electrode 501A, and the electrode 126. Thus, the lower-layer driver circuit 200 can be connected to the word line of the upper-layer memory cell array 201B.

Further, a capacitor line of the upper-layer memory cell array 201B can also be connected to the lower-layer driver circuit 200, like the word line, though not shown.

Next, a method for connecting wirings between a plurality of memory cells in memory cell arrays is described with reference to a pattern diagram shown in FIG. 8. In the pattern diagram shown in FIG. 8, the upper layer is the first memory cell array 201A and the lower layer is the second memory cell array 201B.

Figure 8:
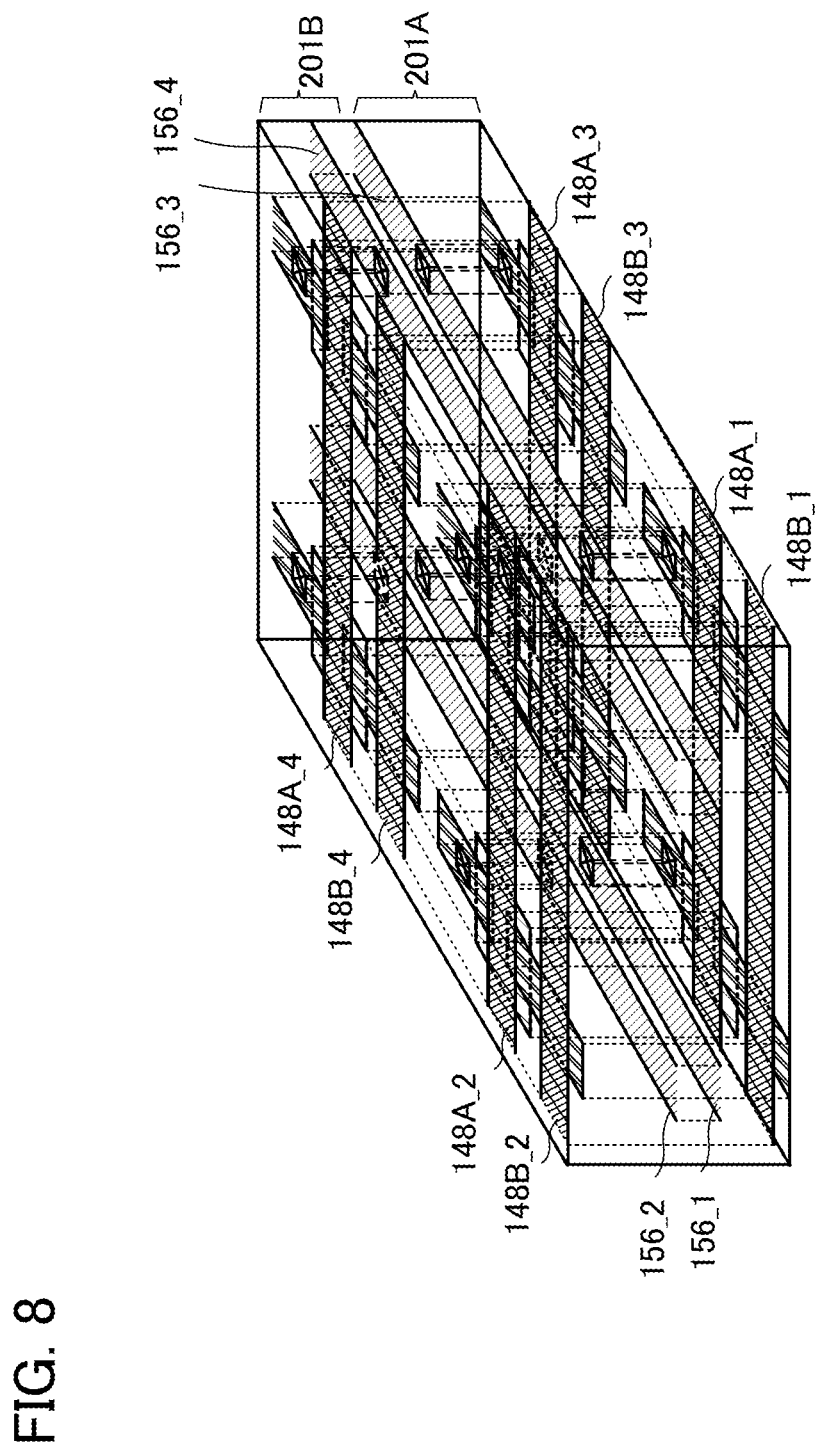
FIG. 8 is a pattern diagram for describing a structure of a storage device.

The first-column wiring 156_1 and a third-column wiring 156_3 in the memory cell array 201A, and the second-column wiring 1562 and a forth-column wiring 156_4 in the memory cell array 201B are arranged as shown in FIG. 8. Further, the first-row electrode 148A_1 and a third-row electrode 148A_3 in the memory cell array 201A, and a second-row electrode 148A_2 and a forth-row electrode 148A_4 in the memory cell array 201B are arranged as shown in FIG. 8. Further, the first-row conductive layer 148B_1 and a third-row conductive layer 148B_3 in the memory cell array 201A, and a second-row conductive layer 148B_2 and a forth-row conductive layer 148B_4 in the memory cell array 201B are arranged as shown in FIG. 8.

As shown in FIG. 8, transistors and capacitors in the memory cells can be arranged depending on positions where the word line intersects with the bit line. Thus, stacking of the memory cell arrays 201A and 201B with a folded bit-line architecture shown in FIG. 8 allows the integration degree of the storage device to be higher than that in the case of a folded bit-line architecture where memory cell arrays are not stacked.

Figure 9A:
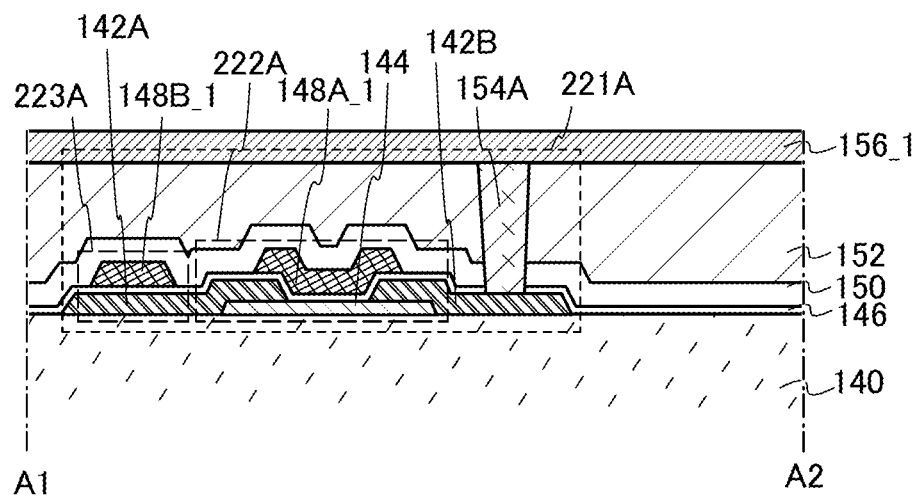
FIGS. 9A and 9B are a cross-sectional diagram and a top view for describing a structure of a storage device.
Figure 9B:
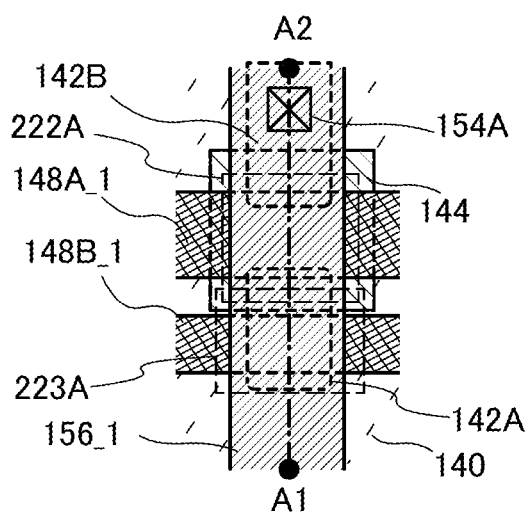

A cross-sectional diagram and a top view of the memory cell in the lower-layer first memory cell array shown in FIG. 8 are shown in FIGS. 9A and 9B, respectively. FIG. 9A is the cross-sectional diagram along A1-A2 which is perpendicular to the channel length direction of the transistor 222A in the top view shown in FIG. 9B; the structure is similar to the structure of the cross-sectional diagram described in FIG. 7B, and thus description thereof is skipped.

Figure 10A:
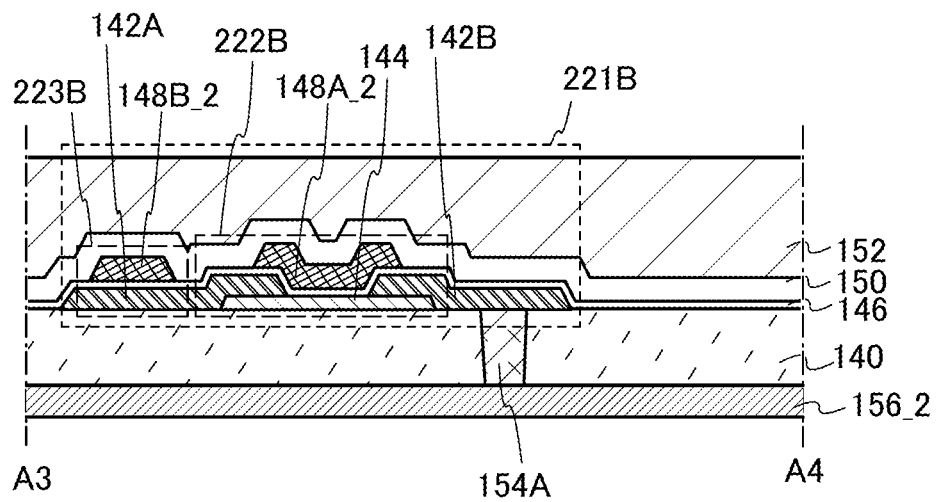
FIGS. 10A and 10B are a cross-sectional diagram and a top view for describing a structure of a storage device.
Figure 10B:
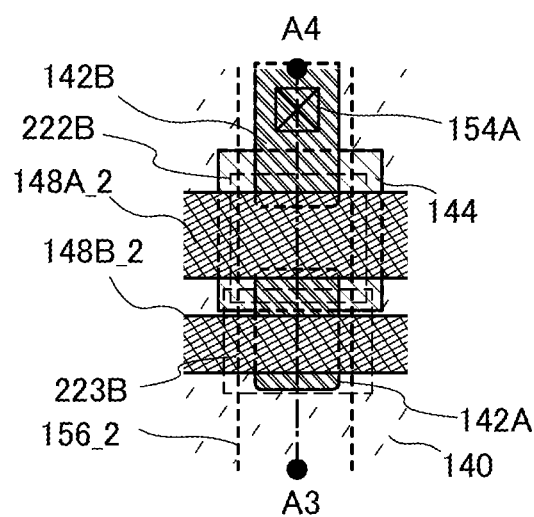

A cross-sectional diagram and a top view of the memory cell in the upper-layer second memory cell array shown in FIG. 8 are shown in FIGS. 10A and 10B, respectively. FIG. 10A is the cross-sectional diagram along A3-A4 which is perpendicular to the channel length direction of the transistor 222B in the top view shown in FIG. 10B.

The transistor 222B is formed over the wiring 1562 with the insulating layer 140 provided therebetween. The electrode 154A is provided in an opening formed in the insulating layer 140. The transistor 222B is formed over the insulating layer 140 and the electrode 154A. The transistor 222B includes the semiconductor layer 144; the electrode 142A and the electrode 142B which are connected to the semiconductor layer 144; the gate insulating layer 146 covering the semiconductor layer 144, the electrode 142A, and the electrode 142B; and an electrode 148A_2 provided over the gate insulating layer 146 so as to overlap with the semiconductor layer 144. The electrode 148A_2 functions as a gate electrode of the transistor 222B. One of the electrode 142A and the electrode 142B functions as a drain electrode of the transistor 222A and the other functions as a source electrode of the same.

A capacitor 223B includes the electrode 142A, the gate insulating layer 146, and a conductive layer 148B_2. That is, the electrode 142A functions as one electrode of the capacitor 223B, and the conductive layer 148B_2 functions as the other electrode of the capacitor 223B. With such a structure, sufficient capacitance can be secured.

The insulating layer 150 and the insulating layer 152 are provided over the transistor 222B and the capacitor 223B. The wiring 156_2 can function as the bit line. The electrode 148A_2 can function as the word line. The conductive layer 148B_2 can function as a capacitor line.

Next, a method for manufacturing a memory cell array is described with reference to FIGS. 11A to 11E. Although the memory cell 221A included in the memory cell array 201A is illustrated in FIGS. 11A to 11E, the memory cell 221B included in the memory cell array 201B can be formed in a similar manner thereto by changing the position of the conductive layer which functions as the bit line from the position over the transistor to the position under the transistor.

Figure 11A:
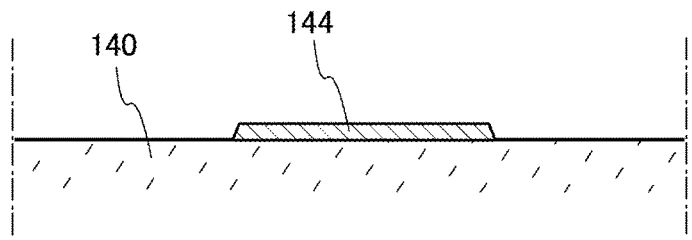
FIGS. 11A to 11E are diagrams illustrating a method for manufacturing a memory cell.

First, an oxide semiconductor layer is formed over the insulating layer 140 and is processed to form the semiconductor layer 144 (see FIG. 11A).

The insulating layer 140 is formed using a material including an inorganic insulating material such as silicon oxide, silicon oxynitride, silicon nitride oxide, silicon nitride, or aluminum oxide. It is preferable to use a low dielectric constant (low-k) material for the insulating layer 140 because it enables capacitance due to overlap of electrodes or wirings to be sufficiently reduced. A porous insulating layer using any of the above materials may be employed as the insulating layer 140. Since the porous insulating layer has low dielectric constant as compared to a dense insulating layer, capacitance due to electrodes or wirings can be further reduced. Alternatively, the insulating layer 140 can be formed using an organic insulating material such as polyimide or acrylic. The insulating layer 140 can be formed to have a single-layer structure or a stacked-layer structure using the above-described material(s). In this embodiment, the case of using silicon oxide for the insulating layer 140 is described.

As for the oxide semiconductor used for the semiconductor layer 144, it is preferable to contain at least indium (In) or zinc (Zn). In particular, In and Zn are preferably contained. Further, as a stabilizer for reducing variation in electric characteristics of a transistor using the oxide semiconductor, it is preferable to further contain gallium (Ga). Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Further, as another stabilizer, one or plural kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

For the semiconductor layer 144, for example, the following can be used: an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, an In—Zr—Zn-based oxide, an Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, the "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

The semiconductor layer 144 may be formed using a material represented by $InMO_3(ZnO)_m$ (m>0, where m is not an integer). Note that M represents one or more metal elements selected from Ga, Fe, Mn, and Co. Alternatively, as the oxide semiconductor, a material represented by $In_2SnO_5(ZnO)_n$ (n>0, where n is a natural number) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of any of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of any of the above compositions may be used.

However, without limitation to the materials given above, any material with an appropriate composition may be used depending on requisite semiconductor characteristics (e.g., mobility, threshold voltage, and variation). To obtain requisite semiconductor characteristics, it is preferable that the carrier density, the impurity concentration, the defect density, the atomic ratio of a metal element to oxygen, the interatomic distance, the density, or the like be set to be appropriate.

The thickness of the semiconductor layer 144 is preferably greater than or equal to 3 nm and less than or equal to 30 nm. This is because the transistor might be normally on if the oxide semiconductor layer is too thick (e.g., the thickness is greater than or equal to 50 nm).

The semiconductor layer 144 is preferably formed by a method in which impurities such as hydrogen, water, a hydroxyl group, or hydride do not enter the semiconductor layer 144 as much as possible. For example, the oxide semiconductor layer can be formed by a sputtering method or the like.

In this embodiment, the semiconductor layer 144 is formed by a sputtering method with the use of an In—Ga—Zn—O-based oxide target.

As the In—Ga—Zn—O-based oxide target, for example, an oxide target with a composition ratio of $In_2O_3:Ga_2O_3:ZnO=1:1:1$ [molar ratio] may be used. It is not necessary to limit the material and the composition ratio of the target to the above. For example, an oxide target with a composition ratio of $In_2O_3:Ga_2O_3:ZnO=1:1:2$ [molar ratio] may be used.

The deposition atmosphere may be a rare gas (typically argon) atmosphere, an oxygen atmosphere, or a mixed atmosphere containing a rare gas and oxygen. An atmosphere of a high-purity gas from which an impurity such as hydrogen, water, a hydroxyl group, or hydride has been removed as much as possible is preferable in order to prevent hydrogen, water, a hydroxyl group, hydride, or the like from entering the oxide semiconductor layer.

For example, the semiconductor layer 144 can be formed as follows.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., more preferably higher than or equal to 350° C. and lower than or equal to 450° C.

Next, a high-purity gas in which impurities such as hydrogen, water, a hydroxyl group, or hydride have been sufficiently removed is introduced into the deposition chamber from which remaining moisture is removed, and the oxide semiconductor layer is formed over the substrate with the use of the target. To remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which has been evacuated with the cryopump, for example, impurities such as hydrogen, water, a hydroxyl group, or hydride (preferably, also a compound containing a carbon atom) or the like have been removed, whereby the concentration of impurities such as hydrogen, water, a hydroxyl group, or hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. Since the oxide semiconductor layer is formed with the substrate heated at the temperature, the substrate temperature becomes high, so that hydrogen bonds are cut by heat and substances containing hydrogen atoms are less likely to be taken into the oxide semiconductor layer. Therefore, the oxide semiconductor layer is formed with the substrate heated at the temperature, whereby the concentration of impurities such as hydrogen, water, a hydroxyl group, or hydride in the oxide semiconductor layer can be sufficiently reduced. Further, damage due to sputtering can be alleviated.

As an example of the film formation conditions, the following conditions can be employed: the distance between the substrate and the target is 60 mm, the pressure is 0.4 Pa, the direct-current (DC) power source is 0.5 kW, the substrate temperature is 400° C., and the film formation atmosphere is an oxygen atmosphere (the proportion of the oxygen flow rate is 100%). It is preferable to use a pulse direct-current power source because it leads to a suppression of generation of powder substances (also referred to as particles or dust) in deposition and makes the film thickness distribution uniform.

Note that before the oxide semiconductor layer is formed by a sputtering method, powder substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface of the substrate side. Instead of argon, a gas of nitrogen, helium, oxygen, or the like may be used.

The oxide semiconductor layer is processed, so that the semiconductor layer 144 is formed. The oxide semiconductor layer can be processed by being etched after a mask having a desired shape is formed over the oxide semiconductor layer. The mask may be formed by photolithography, an ink-jet method, or the like. For the etching of the oxide semiconductor layer, either dry etching or wet etching may be employed. It is needless to say that both of them may be employed in combination.

After that, heat treatment (first heat treatment) may be performed on the semiconductor layer 144. With the heat treatment, substances including hydrogen atoms in the semiconductor layer 144 can be further removed. The heat treatment is performed under an inert gas atmosphere at a temperature higher than or equal to 250° C. and lower than or equal to 700° C., preferably higher than or equal to 450° C. and lower than or equal to 600° C., or less than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or the rare gas such as helium, neon, or argon introduced into the heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a way that, for example, an object to be heated is introduced into an electric furnace using a resistance heating element or the like and heated, under a nitrogen atmosphere at 450° C. for one hour. During the heat treatment, the semiconductor layer 144 is not exposed to air to prevent entry of water and hydrogen.

Impurities are reduced by the heat treatment, so that a transistor with extremely excellent characteristics can be realized.

Note that an impurity imparting p-type conductivity such as tin (Sn) may be added to the semiconductor layer 144; in that case, the semiconductor layer 144 exhibits slight (weak) p-type conductivity. A small amount of an impurity for controlling valence electrons can be added to the oxide semiconductor layer which is highly purified as described above, so that the semiconductor layer 144 can exhibit weak p-type conductivity. In this manner, the threshold voltage of the transistor 222A can be slightly shifted in the positive direction. Accordingly, the transistor 222A can be prevented from becoming normally on and the off-state current can be further reduced.

The above-described heat treatment has an effect of removing hydrogen, water, and the like and thus can be referred to as dehydration treatment, dehydrogenation treatment, or the like. The heat treatment can be performed at the timing, for example, before the oxide semiconductor layer is processed to have an island shape, after the gate insulating film is formed, or the like. Such dehydration treatment or dehydrogenation treatment may be performed plural times.

Figure 11B:
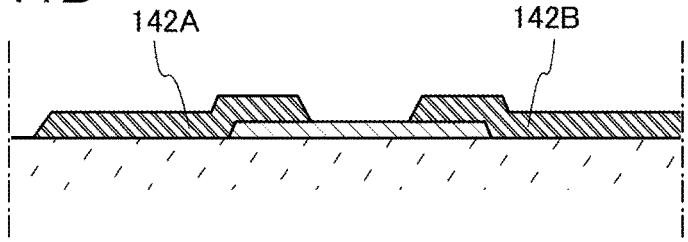

Next, a conductive layer for forming a source electrode and a drain electrode (including a wiring formed of the same layer as the source electrode and the drain electrode) is formed over the semiconductor layer 144 and the like and is processed, so that the electrode 142A and the electrode 142B are formed (see FIG. 11B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer can have a single-layer structure or a stacked-layer structure consisting of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. In the case where the conductive layer has a single-layer structure of a titanium film or a titanium nitride film, there is an advantage that the conductive layer can be easily processed into the electrodes 142A and 142B each having a tapered shape.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$), an indium oxide-zinc oxide alloy ($In_2O_3$—ZnO), or any of these metal oxide materials with silicon or silicon oxide can be used.

The conductive layer is preferably etched such that end portions of the electrodes 142A and 142B are tapered. Here, the taper angle is, for example, preferably greater than or equal to 30° and less than or equal to 60°. Such an etching of the electrodes 142A and 142B to have tapered end portions enables coverage with the gate insulating layer 146 which is formed later to be improved and disconnection of the gate insulating layer 146 to be prevented.

Figure 11C:
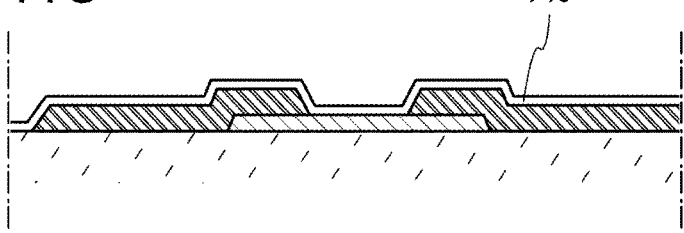

Next, the gate insulating layer 146 is formed so as to cover the electrodes 142A and 142B and to be in contact with part of the semiconductor layer 144 (see FIG. 11C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked-layer structure in which these elements are combined. There is no particular limitation on the thickness of the gate insulating layer 146; the thickness is preferably small in order to ensure the operation of the transistor when the storage device is miniaturized. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as is described above, a problem of gate leakage due to a tunnel effect or the like is caused. To solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using the high-k material for the gate insulating layer 146, electrical characteristics can be ensured and the thickness can be increased to prevent gate leakage. A stacked-layer structure of a film containing a high-k material and a film containing any one of silicon oxide, silicon nitride, silicon oxynitride, silicon nitride oxide, aluminum oxide, and the like may be employed.

Further, the insulating layer in contact with the semiconductor layer 144 (in this embodiment, the insulating layer 140 and the gate insulating layer 146) may be formed using an insulating material containing a Group 13 element and oxygen. Many of oxide semiconductor materials contain a Group 13 element, and thus an insulating material containing a Group 13 element well compatible with an oxide semiconductor; by using such an insulating material containing a Group 13 element for the insulating layer in contact with the oxide semiconductor layer, the condition of an interface between the oxide semiconductor layer and the insulating layer can be kept favorable.

The insulating material containing a Group 13 element refers to an insulating material containing one or more Group 13 elements. As examples of the insulating material containing a Group 13 element, a gallium oxide, an aluminum oxide, an aluminum gallium oxide, a gallium aluminum oxide, and the like are given. Here, the aluminum gallium oxide refers to a material in which the amount of aluminum is larger than that of gallium in atomic percent, and the gallium aluminum oxide refers to a material in which the amount of gallium is larger than or equal to that of aluminum in atomic percent.

For example, in the case of forming a gate insulating layer in contact with an oxide semiconductor layer containing gallium, the use of a material containing gallium oxide for the gate insulating layer allows the characteristics of the interface between the oxide semiconductor layer and the gate insulating layer to be kept favorable. Further, by providing the oxide semiconductor layer and the insulating layer containing gallium oxide in contact with each other, pileup of hydrogen at the interface between the oxide semiconductor layer and the insulating layer can be reduced. A similar effect to the above can be obtained in the case where an element belonging to the same group as a constituent element of the oxide semiconductor is used for the insulating layer. For example, it is effective to form an insulating layer with the use of a material containing an aluminum oxide. Since water is less likely to permeate an aluminum oxide, it is preferable to use such a material also in terms of preventing entry of water to the oxide semiconductor layer.

The insulating layer in contact with the semiconductor layer 144 is preferably made to contain oxygen in a proportion higher than that in the stoichiometric composition by heat treatment in an oxygen atmosphere, oxygen doping, or the like. The "oxygen doping" refers to addition of oxygen into the bulk. The term "bulk" is used in order to clarify that oxygen is added not only to a surface of the thin film but also to the inside of the thin film. In addition, the oxygen doping includes in its category oxygen plasma doping in which oxygen which is made to be plasma is added to the bulk. The oxygen doping may be performed using an ion implantation method or an ion doping method.

For example, in the case where the insulating layer in contact with the semiconductor layer 144 is formed using gallium oxide, the composition of gallium oxide can be set to be $Ga_2O_x$ ($x=3+\alpha$, $0<\alpha<1$) by heat treatment in an oxygen atmosphere or by oxygen doping. In the case where the insulating layer in contact with the semiconductor layer 144 is formed using aluminum oxide, the composition of aluminum oxide can be set to be $Al_2O_x$ ($x=3+\alpha$, $0<\alpha<1$) by heat treatment under an oxygen atmosphere or by oxygen doping. In the case where the insulating film in contact with the semiconductor layer 144 is formed using a gallium aluminum oxide (aluminum gallium oxide), the composition of the gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By the oxygen doping or the like, an insulating layer which includes a region where the proportion of oxygen is higher than that in the stoichiometric composition can be formed. The insulating layer including such a region is in contact with the oxide semiconductor layer, whereby excess oxygen that exists in the insulating layer is supplied to the oxide semiconductor layer, and oxygen deficiency in the oxide semiconductor layer or at the interface between the oxide semiconductor layer and the insulating layer is reduced. Thus, the oxide semiconductor layer can be formed to be an intrinsic (i-type) or substantially i-type oxide semiconductor.

Note that the insulating layer having a region where the proportion of oxygen is higher than that in the stoichiometric proportion may be applied to the insulating layer 140 serving as a base film for the semiconductor layer 144, instead of the gate insulating layer 146, or may be applied to both the gate insulating layer 146 and the base insulating layer 140.

After the gate insulating layer 146 is formed, second heat treatment is preferably performed in an inert gas atmosphere or an oxygen atmosphere. The temperature of the heat treatment is a temperature higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. With the second heat treatment, variation in electric characteristics of the transistor can be reduced. Further, in the case where the gate insulating layer 146 includes oxygen, oxygen can be supplied to the semiconductor layer 144 to repair oxygen vacancies in the semiconductor layer 144, so that an i-type (intrinsic semiconductor) or substantially i-type oxide semiconductor layer can be formed.

Although the second heat treatment is performed after the gate insulating layer 146 is formed in this embodiment, the timing of the second heat treatment is not limited thereto. For example, the second heat treatment may be performed after the gate electrode is formed. Further, the second heat treatment may be performed following the first heat treatment, the first heat treatment may double as the second heat treatment, or the second heat treatment may double as the first heat treatment.

At least one of the first heat treatment and the second heat treatment is performed as described above, whereby the semiconductor layer 144 can be highly purified so as not to contain the substances including hydrogen atoms as much as possible.

Figure 11D:
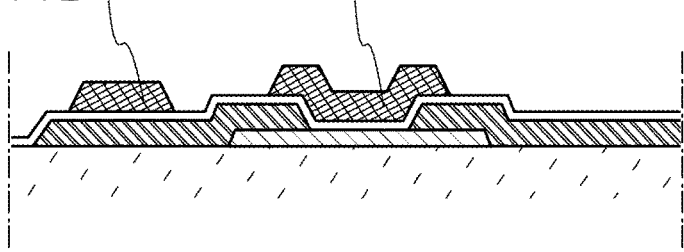

Next, a conductive layer for forming a gate electrode (including a wiring formed of the same layer as the gate electrode) is formed and processed to form the electrode 148A_1 and the conductive layer 148B_1 (see FIG. 11D).

The electrode 148A_1 and the conductive layer 148B_1 can be formed using a metal material such as molybdenum, titanium, tantalum, tungsten, aluminum, copper, neodymium, or scandium, or an alloy material containing any of these materials as a main component. Either the electrode 148A_1 or the conductive layer 148B_1 may have a single-layer structure or a stacked-layer structure.

Figure 11E:
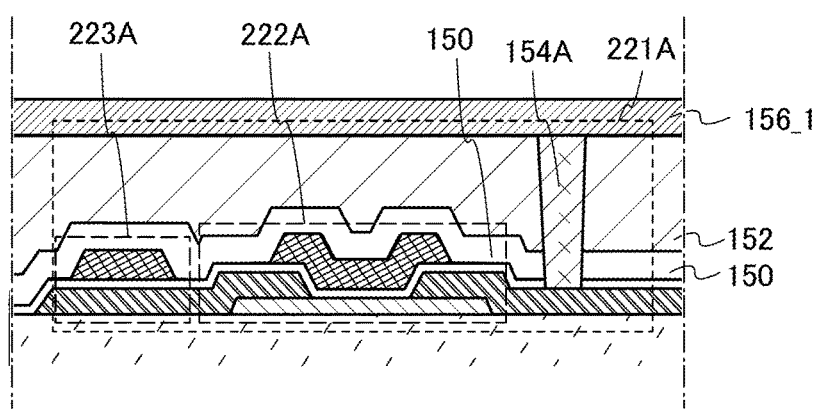

Next, the insulating layer 150 is formed over the gate insulating layer 146, the electrode 148 A_1, and the conductive layer 148 B_1 (see FIG. 11E). The insulating layer 150 can be formed by a PVD method, a CVD method, or the like. The insulating layer 150 can be formed using a material containing an inorganic insulating material such as silicon oxide, silicon oxynitride, silicon nitride, hafnium oxide, gallium oxide, or aluminum oxide. For the insulating layer 150, a material with a low dielectric constant or a structure with a low dielectric constant (e.g., a porous structure) may be preferably employed. This is because by reducing the dielectric constant of the insulating layer 150, capacitance formed between wirings and electrodes can be reduced, which increases operation speed. Although the insulating layer 150 has a single-layer structure in this embodiment, embodiments of the disclosed invention are not limited to this; the insulating layer 150 may have a stacked-layer structure consisting of two or more layers.

Next, the insulating layer 152 is formed over the insulating layer 150 (see FIG. 11E). Since the second memory cell is stacked over the first memory cell, a surface of the insulating layer 152 is preferably planarized by CMP or the like.

Next, an opening that reaches the electrode 142B is formed in the gate insulating layer 146, the insulating layer 150, and the insulating layer 152. The electrode 154A is formed in the opening. Then, the wiring 156_1 in contact with the electrode 154A is formed over the insulating layer 152 (see FIG. 11E). The opening is formed by selective etching using a mask or the like.

The wiring 156_1 is formed by forming a conductive layer by a PVD method or a CVD method and then patterning the conductive layer. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

More specifically, the electrode 154A can be formed in such a manner that a thin titanium film (about 5 nm) is formed in a region including the opening formed in the insulating layer 150 and the insulating layer 152 by a PVD method and then an aluminum film is formed so as to fill the opening, for example. Here, the titanium film formed by a PVD method have a function of reducing an oxide film (e.g., a natural oxide film) formed on a surface where the titanium film is formed, and to decrease the contact resistance with the lower electrode or the like (here, the electrode 142B). In addition, hillock of the aluminum film can be prevented. Alternatively, a barrier film of titanium, titanium nitride, or the like may be formed, and then, a copper film may be formed by a plating method.

Through the above process, the transistor 222A using the highly purified semiconductor layer 144 and the capacitor 223A are completed (see FIG. 11E).

Here, in a structure in which a memory cell is stacked over the memory cell illustrated in FIG. 11E, the insulating layer 140 is formed so as to cover the wiring 156_1. Then, a conductive layer functioning as a bit line connected to the second memory cell may be formed over the insulating layer 140.

The insulating layer 140 can be formed by a PVD method, a CVD method, or the like. The insulating layer 140 can be formed so as to have a single-layer structure or a stacked-layer structure using a material including an inorganic insulating material such as silicon oxide, silicon oxynitride, silicon nitride, hafnium oxide, gallium oxide, or aluminum oxide or a material including an organic material such as polyimide or acrylic.

In the transistor 222A described in this embodiment, since the semiconductor layer 144 is highly purified, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. In addition, the carrier density of the semiconductor layer 144 is sufficiently low (e.g., less than $1 \times 10^{12}$/cm$^3$, preferably less than $1.45 \times 10^{10}$/cm$^3$) as compared to the carrier density of a general silicon wafer (about $1 \times 10^{14}$/cm$^3$). In addition, the off-state current of the transistor 222A is also sufficiently small. For example, the off-state current (here, per micrometer (μm) of channel width) of the transistor 222A at room temperature (25° C.) is 100 zA/μm (1 zA (zeptoampere) is $1 \times 10^{-21}$ A) or less, preferably 10 zA/μm or less.

Further, the concentration of an alkali metal or an alkaline earth metal is sufficiently decreased in the semiconductor layer 144. The concentration of an alkali metal or an alkaline earth metal is decreased to such a degree that, for example, the concentration of Na is $5 \times 10^{16}$ cm$^{-3}$ or less, preferably $1 \times 10^{16}$ cm$^{-3}$ or less, more preferably $1 \times 10^{15}$ cm$^{-3}$ or less, the concentration of Li is $5 \times 10^{15}$ cm$^{-3}$ or less, preferably $1 \times 10^{15}$ cm$^{-3}$ or less, and the concentration of K is $5 \times 10^{15}$ cm$^{-3}$ or less, preferably $1 \times 10^{15}$ cm$^{-3}$ or less.

The semiconductor layer 144 which is highly purified and is made intrinsic in this manner enables the off-state current of the transistor 222A to be easily sufficiently decreased. Thus, with the use of the transistor 222A, a storage device in which stored data can be retained for an extremely long time can be provided.

The structures, methods, and the like described in this embodiment can be combined as appropriate with any structure, any method, and the like described in the other embodiments.

Embodiment 3

In this embodiment, application of the storage device described in any of the above embodiments to a semiconductor device such as an electronic device is described with reference to FIGS. 12A to 12F. In this embodiment, application of the above-described storage device to electronic devices such as a computer, a cellular phone (also referred to as a mobile phone or a mobile phone set), a portable information terminal (including a portable game machine, an audio reproducing device, and the like), a camera such as a digital camera or a digital video camera, electronic paper, and a television set (also referred to as a television or a television receiver) is described.

Figure 12A:
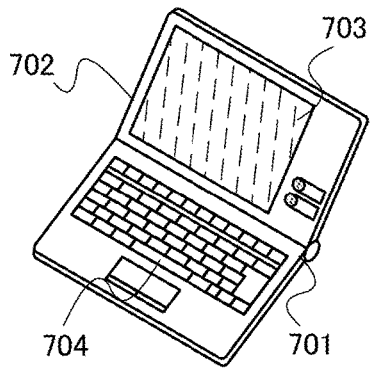
FIGS. 12A to 12F are views illustrating electronic devices each including a storage device.

FIG. 12A illustrates a laptop personal computer including a housing 701, a housing 702, a display portion 703, a keyboard 704, and the like. At least one of the housings 701 and 702 is provided with the storage device described in any of the above embodiments is provided. Accordingly, a laptop personal computer in which the data storage capacity is increased, and errors in data reading due to noise are reduced can be achieved.

Figure 12D:
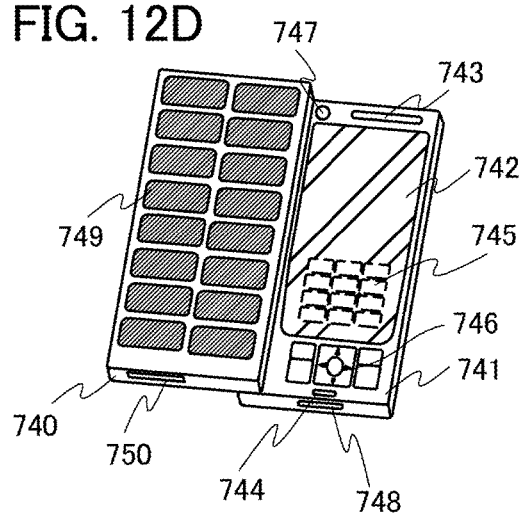
Figure 12B:
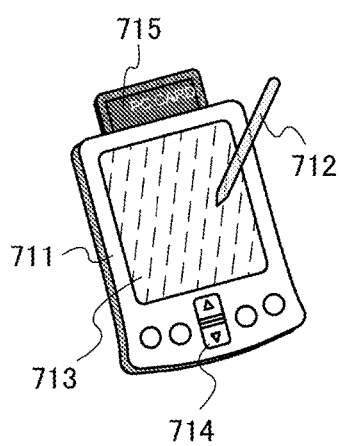

FIG. 12B illustrates a portable information terminal (personal digital assistant (PDA)). A main body 711 is provided with a display portion 713, an external interface 715, operation buttons 714, and the like. Further, a stylus 712 and the like for operation of the portable information terminal are provided. In the main body 711, the storage device described in any of the above embodiments is provided. Accordingly, a portable information terminal in which the data storage capacity is increased, and errors in data reading due to noise are reduced can be achieved.

Figure 12E:
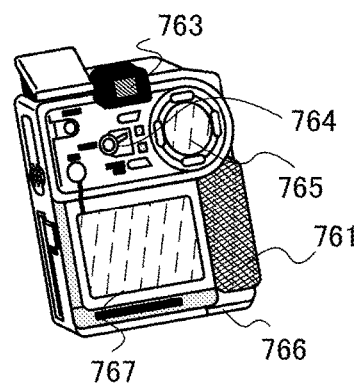
Figure 12C:
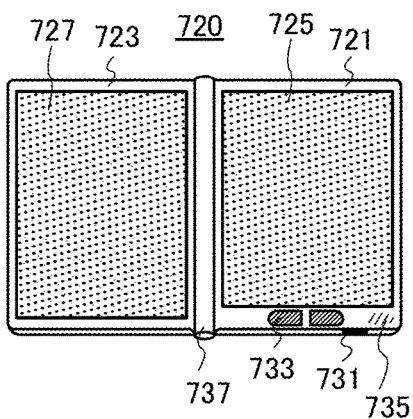

FIG. 12C illustrates an e-book reader 720 mounting electronic paper, which has two housings, a housing 721 and a housing 723. The housing 721 and the housing 723 are provided with a display portion 725 and a display portion 727, respectively. The housings 721 and 723 are connected by a hinge portion 737 and can be opened and closed with the hinge portion 737. The housing 721 is provided with a power supply switch 731, an operation key 733, a speaker 735, and the like. At least one of the housings 721 and 723 is provided with the storage device described in any of the above embodiments. Accordingly, an e-book reader in which the data storage capacity is increased, and errors in data reading due to noise are reduced can be achieved.

FIG. 12D illustrates a mobile phone including two housings, a housing 740 and a housing 741. The housings 740 and 741 in a state where they are developed as illustrated in FIG. 12D can be slid so that one is lapped over the other, whereby the size of the mobile phone can be reduced, which makes the mobile phone suitable for being carried around. The housing 741 is provided with a display panel 742, a speaker 743, a microphone 744, an operation key 745, a pointing device 746, a camera lens 747, an external connection terminal 748, and the like. The housing 740 is provided with a solar cell 749 for charging the mobile phone, an external memory slot 750, and the like. In addition, an antenna is incorporated in the housing 741. At least one of the housings 740 and 741 is provided with the storage device described in any of the above embodiments. Accordingly, a mobile phone in which the data storage capacity is increased, and errors in data reading due to noise are reduced can be achieved.

FIG. 12E illustrates a digital camera including a main body 761, a display portion 767, an eyepiece portion 763, an operation switch 764, a display portion 765, a battery 766, and the like. In the main body 761, the storage device described in any of the above embodiments is provided. Accordingly, a digital camera in which the data storage capacity is increased, and errors in data reading due to noise are reduced can be achieved.

Figure 12F:
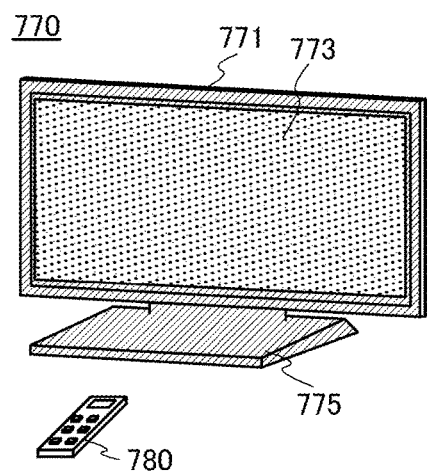

FIG. 12F illustrates a television device 770 including a housing 771, a display portion 773, a stand 775, and the like. The television set 770 can be operated with a switch of the housing 771 or a remote controller 780. The storage device described in any of the above embodiments is mounted on the housing 771 and the remote controller 780. Accordingly, a television device in which the data storage capacity is increased, and errors in data reading due to noise are reduced can be achieved.

As described above, the storage device of any of the above embodiments is mounted on each of the electronic devices described in this embodiment. Accordingly, an electronic device in which the data storage capacity is increased, and errors in data reading due to noise are reduced can be achieved.

This application is based on Japanese Patent Application serial no. 2011-274094 filed with Japan Patent Office on Dec. 15, 2011, the entire contents of which are hereby incorporated by reference.

What is claimed is:

1. A semiconductor device comprising:
a driver circuit comprising a sense amplifier, the sense amplifier being electrically connected to a first bit line and a second bit line;
a first memory cell array comprising a first memory cell, the first memory cell being electrically connected to the first bit line and a first word line, and the first memory cell being over the driver circuit; and
a second memory cell array comprising a second memory cell over the first memory cell array, the second memory cell being electrically connected to the second bit line and a second word line,
wherein the first bit line is provided over the first word line,
wherein the second word line is provided over the second bit line, and
wherein the first memory cell overlaps with the second memory cell.

2. The semiconductor device according to claim 1, wherein the first memory cell array is provided over the driver circuit.

3. The semiconductor device according to claim 2, wherein the driver circuit comprises a transistor comprising a channel formation region in a single-crystal semiconductor substrate.

4. The semiconductor device according to claim 1, wherein each of the first memory cell and the second memory cell comprises a transistor comprising an oxide semiconductor layer having a channel region.

5. The semiconductor device according to claim 4, wherein the oxide semiconductor layer comprises indium, zinc, and one or more metal elements selected from gallium, tin, hafnium, aluminum, and zirconium.

6. The semiconductor device according to claim 1, wherein the first bit line and the second bit line are provided between the first word line and the second word line.

7. A semiconductor device comprising:
a driver circuit comprising a sense amplifier, the sense amplifier being electrically connected to a first bit line and a second bit line;
a first memory cell array comprising a first memory cell comprising a first transistor, the first transistor comprising a first gate electrode, a first source electrode, a first drain electrode, and a first semiconductor layer, wherein one of the first source electrode and the first drain electrode is electrically connected to the first bit line, and the first gate electrode is electrically connected to a first word line; and
a second memory cell array comprising a second memory cell comprising a second transistor, the second transistor comprising a second gate electrode, a second source electrode, a second drain electrode, and a second semiconductor layer, wherein the one of the second source electrode and the second drain electrode is electrically connected to the second bit line, and the second gate electrode is electrically connected to a second word line,
wherein the first bit line is provided over the first word line,
wherein the second word line is provided over the second bit line,
wherein the first memory cell overlaps with the second memory cell,
wherein the first memory cell array is provided over the driver circuit, and
wherein the second memory cell array is provided over the first memory cell.

8. The semiconductor device according to claim 7, wherein the first memory cell array is provided over the driver circuit.

9. The semiconductor device according to claim 8, wherein the driver circuit comprises a third transistor comprising a channel formation region in a single-crystal semiconductor substrate.

10. The semiconductor device according to claim 7, wherein each of the first semiconductor layer and the second semiconductor layer comprises an oxide semiconductor.

11. The semiconductor device according to claim 10, wherein the oxide semiconductor comprises indium, zinc, and one or more metal elements selected from gallium, tin, hafnium, aluminum, and zirconium.

12. The semiconductor device according to claim 7, wherein the first bit line and the second bit line are provided between the first word line and the second word line.

13. A semiconductor device comprising:
- a driver circuit comprising a sense amplifier, the sense amplifier being electrically connected to a first bit line and a second bit line;
- a first memory cell array comprising a first memory cell comprising a first transistor, the first transistor comprising:
  - a first semiconductor layer;
  - a first source electrode and a first drain electrode over the first semiconductor layer, one of the first source electrode and the first drain electrode being electrically connected to the first bit line,
  - a first insulating layer over the first source electrode, the first drain electrode, and the first semiconductor layer; and
  - a first gate electrode over the first insulating layer, the first gate electrode being electrically connected to a first word line; and
- a second memory cell array comprising a second memory cell comprising a second transistor, the second transistor comprising:
  - a second semiconductor layer;
  - a second source electrode and a second drain electrode over the second semiconductor layer, one of the second source electrode and the second drain electrode being electrically connected to the second bit line,
  - a second insulating layer over the second source electrode, the second drain electrode, and the second semiconductor layer; and
  - a second gate electrode over the second insulating layer, the second gate electrode being electrically connected to a second word line,
- wherein the first bit line is provided over the first word line,
- wherein the second word line is provided over the second bit line,
- wherein the first memory cell overlaps with the second memory cell,
- wherein the first memory cell array is provided over the driver circuit, and
- wherein the second memory cell array is provided over the first memory cell.

14. The semiconductor device according to claim 13, wherein the first memory cell array is provided over the driver circuit.

15. The semiconductor device according to claim 14, wherein the driver circuit comprises a third transistor comprising a channel formation region in a single-crystal semiconductor substrate.

16. The semiconductor device according to claim 13, wherein each of the first semiconductor layer and the second semiconductor layer comprises an oxide semiconductor.

17. The semiconductor device according to claim 16, wherein the oxide semiconductor comprises indium, zinc, and one or more metal elements selected from gallium, tin, hafnium, aluminum, and zirconium.

18. The semiconductor device according to claim 13, wherein the first bit line and the second bit line are provided between the first word line and the second word line.

19. A semiconductor device comprising:
- a driver circuit comprising a sense amplifier, the sense amplifier being electrically connected to a first bit line and a second bit line;
- a first memory cell array comprising a first memory cell, the first memory cell being electrically connected to the first bit line and a first word line; and
- a second memory cell array comprising a second memory cell over the first memory cell array, the second memory cell being electrically connected to the second bit line and a second word line,
- wherein the first bit line is provided over the first word line,
- wherein the second word line is provided over the second bit line, and
- wherein the first memory cell overlaps with the second memory cell.

20. The semiconductor device according to claim 19, wherein each of the first memory cell and the second memory cell comprises a transistor comprising an oxide semiconductor layer having a channel region.

* * * * *